US00RE37217E

(19) United States
(12) Reissued Patent
Kobayashi

(10) Patent Number: US RE37,217 E
(45) Date of Reissued Patent: Jun. 12, 2001

(54) OPERATIONAL AMPLIFIER HAVING STABLE OPERATIONS FOR A WIDE RANGE OF SOURCE VOLTAGE, AND CURRENT DETECTOR CIRCUIT EMPLOYING A SMALL NUMBER OF ELEMENTS

(75) Inventor: Osamu Kobayashi, Kawasaki (JP)

(73) Assignee: Fujitsu Limited, Kawasaki (JP)

(21) Appl. No.: 09/259,272

(22) Filed: Feb. 24, 1999

Related U.S. Patent Documents

Reissue of:
(64) Patent No.: 5,606,287
Issued: Feb. 25, 1997
Appl. No.: 08/412,561
Filed: Mar. 29, 1995

(30) Foreign Application Priority Data

Jun. 17, 1994 (JP) ..... 6-135426
Jul. 7, 1994 (JP) ..... 6-155875

(51) Int. Cl.[7] ..... H03F 3/26
(52) U.S. Cl. ..... 330/255; 330/264
(58) Field of Search ..... 330/253, 255, 330/263, 264, 267

(56) References Cited

U.S. PATENT DOCUMENTS 4,599,575 * 7/1986 Bernard ..... 330/288
4,800,339 * 1/1989 Tanimoto et al. ..... 330/255 X
4,912,425 * 3/1990 Kobayashi et al. ..... 330/255 X
5,055,796 * 10/1991 Schaffer ..... 330/263
5,606,287 * 2/1997 Kobayashi et al. ..... 330/255

FOREIGN PATENT DOCUMENTS 0 161 154 * 11/1985 (EP) .
0 256 729 * 2/1988 (EP) .
0 318 396 * 5/1989 (EP) .
2 010 038 * 6/1979 (GB) .
1-137 808 * 5/1989 (JP) .

* cited by examiner

*Primary Examiner*—Steven J. Mottola
(74) *Attorney, Agent, or Firm*—Armstrong, Westerman, Hattori, McLeland & Naughton

(57) ABSTRACT

An operational amplifier has a differential amplification section, an output section, a control signal generation unit, and a drive control unit. The output section has a first transistor of a first conductivity type and a second transistor of a second conductivity type that is opposite to the first conductivity type. The first and second transistors are connected in series between a first power source unit and a second power source unit, and the first transistor is driven according to an output of the differential amplification section. The control signal generation unit is used to detect a current flowing through the first transistor and generate a control signal in response to the detected current. The drive control unit is used to drive the second transistor in response to the control signal.

31 Claims, 18 Drawing Sheets

Fig. 9A
(Prior Art)
INPUT AND OUTPUT
| | I1 | I2 |
|---|---|---|
| V+>V- | G*(V+-V-) | 0 |
| V+=V- | 0 | 0 |
| V+<V- | 0 | G*(V-V+) |
Fig. 9B
(Prior Art)
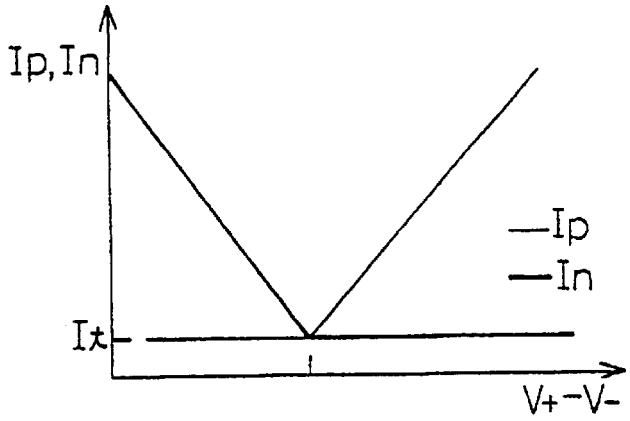
Ip=A(I1+Iref)
In=A(I2+Iref)
It=A * Iref
Fig. 9C
(Prior Art)
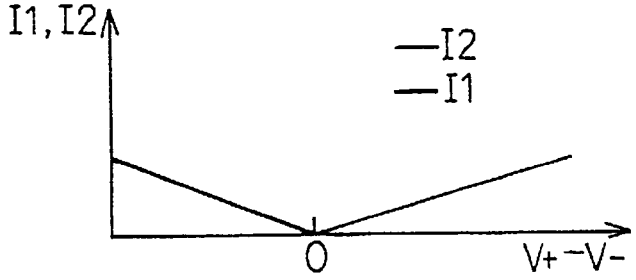

| CURRENT IN OUTPUT SECTION | GATE VOLTAGE | THROUGH CURRENT It |
|---|---|---|
| Ip=In | Vg1=Vg2 | 2*S*Iref |
| Ip>In | Vg1>Vg2 | S*Iref |
| Ip<In | Vg1<Vg2 | S*Iref |

Fig. 19A

CURRENTS UNDER NORMAL OPERATION

| D1~Dn | I(TrA) | I(TrB) | Iout |
|---|---|---|---|
| H | n*I1+I2 | 0 | 0 |
| L | I2 | n*I1 | 0 |

Fig. 19B

CURRENTS UNDER FAULT OF Dk

| D1~Dn | Dk | I(TrA) | I(TrB) | Iout |
|---|---|---|---|---|
| H | L | (n-1)n*I1-I2 | I1 | S*I1 |
| L | H | I1-I2 | (n-1)*I1 | S*I1 |

S:TRANSFER RATIO

OPERATIONAL AMPLIFIER HAVING STABLE OPERATIONS FOR A WIDE RANGE OF SOURCE VOLTAGE, AND CURRENT DETECTOR CIRCUIT EMPLOYING A SMALL NUMBER OF ELEMENTS

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to an operational amplifier, and more particularly, to an operational amplifier having an output section constituted by a push-pull circuit.

Further, the present invention also relates to a current detector circuit and an amplifier employing the current detector circuit, and more particularly, to a current detector circuit for selecting a smaller one from current values (two current values) of a current flowing through a detecting object (detecting device) and maintain the current flowing through the detecting object at a predetermined value and an amplifier employing the current detector circuit, capable of operating with a low source voltage.

2. Description of the Related Art

Recently, compact and low-power-consumption electronic apparatuses have been developed. Portable electronic devices are mostly driven by batteries. Homeuse and office-use electronic apparatuses driven by, for example, AC 100 (117, 200, or 220) V usually employ semiconductor integrated circuits (LSIs) operating with a power source voltage of 5 V.

The portable devices driven by battery, however, usually operate with a power source voltage of 3 V. The battery voltage decreases as the battery wares. LSIs in the portable devices must deal with such a fluctuation in the source voltage and a variety of source voltages ranging from 3 to 5 V. Namely, the LSIs must be stable for a wide range of source voltages.

To let an analog circuit operate for a wide range of source voltages, an operational amplifier plays an important role. An operational amplifier whose output section constituted by a push-pull circuit may be used for heavy load or a high-speed operation in an analog-digital mixed signal LSI consisting of CMOSs. In this case, the operational amplifier must be particularly stable. It is required to provide an operational amplifier that shows stable performance for a wide range of source voltages.

By the way, low-frequency amplifiers are classified into classes A, B, and AB. The A-class amplifiers involve a low signal distortion but large power consumption. The B-class amplifiers involve a large signal distortion but small power consumption. The AB-class amplifiers involve a small signal distortion and small power consumption.

Amplifiers for driving speakers must provide a large current at low distortion. For this purpose, the A-class amplifiers consume large power even when there are no signals, and the B-class amplifiers cause a problem of crossover. Accordingly, the AB-class amplifiers are usually employed to drive speakers.

To reduce power consumption low-voltage power source are widely used. It is necessary, therefore, to develop amplifiers operating with a low-voltage power source.

SUMMARY OF THE INVENTION

An object of a first aspect of the present invention is to provide an operational amplifier that operates stably for a wide range of source voltages. An object of a second aspect of the present invention is to provide a current detector circuit for selecting a smaller one from current values of a current flowing through a detecting object (detection device) and control the current to a predetermined value, as well as providing an amplifier employing the current detector circuit, to operate with a low-voltage power source.

According to a first aspect of the present invention, there is provided an operational amplifier comprising a differential amplification section; an output section having a first transistor of a first conductivity type and a second transistor of a second conductivity type that is opposite to the first conductivity type, the first and second transistors being connected in series between a first power source unit and a second power source unit, the first transistor being driven according to an output of the differential amplification section; a control signal generation unit for detecting a current flowing through the first transistor and generating a control signal in response to the detected current; and a drive control unit for driving the second transistor in response to the control signal.

The drive control unit may control the second transistor to increase a current flowing through the second transistor if the current flowing through the first transistor detected by the control signal generation unit decreases. The control signal generation unit may have a third transistor of the first conductivity type having a first terminal connected to the first power source and a control terminal connected to the output of the differential amplification section as well as to the control terminal of the first transistor; and the drive control unit may have fourth and fifth transistors of the first conductivity type having first terminals connected to the first power source unit, a sixth transistor of the second conductivity type having a first terminal connected to the second power source unit and a control terminal and a second terminal connected to the second terminal of the fifth transistor as well as to the control terminal of the second transistor, and a constant current source, the control terminal and second terminal of the fourth transistor being connected to the second power source unit through the constant current source, to the control terminal of the fifth transistor, and to the second terminal of the third transistor, to receive the control signal from the control signal generation unit. The first transistor may be connected to the third transistor in a current mirror configuration, the fourth transistor may be connected to the fifth transistor in a current mirror configuration, and the second transistor may be connected to the sixth transistor in a current mirror configuration.

The control signal generation unit may have a third transistor of a first conductivity type having a first terminal connected to the first power source unit and a control terminal connected to the output of the differential amplification section as well as to the control terminal of the first transistor; and the drive control unit may have fourth, fifth, and sixth transistor of the second conductivity type having first terminals connected to the second power source unit, and a constant current source, the second terminal of the fifth transistor, the second terminal and control terminal of the sixth transistor, and the control terminal of the second transistor being connected to the first power source unit through the constant current source, the second terminal and control terminal of the fourth transistor and the control terminal of the fifth transistor being connected to the second terminal of the third transistor, to receive the control signal from the control signal generation unit. The first transistor may be connected to the third transistor in a current mirror configuration, the fourth transistor may be connected to the fifth transistor in a current mirror configuration, and the second transistor may be connected to the sixth transistor in a current mirror configuration.

The drive control unit may control the second transistor to pass a current if a current flowing through the first transistor detected by the control signal generation unit is larger than a predetermined value. The control signal generation unit may have a third terminal connected to the first conductivity type having a first terminal connected to the first power source unit and a control terminal connected to the output of the differential amplification section as well as to the control terminal of the first transistor; and the drive control unit may have a load unit, a fourth transistor of the first conductivity type having a first terminal connected to the control terminal of the first transistor as well as to the control terminal of the third transistor and a second terminal connected to the control terminal of the second transistor as well as to the second power source unit through the load unit, and a first constant current source, the second terminal of the third transistor and the control terminal of the fourth transistor being connected to the second power source unit through the first constant current source.

The operational amplifier may further comprise a second constant current source arranged between the second power source unit and a node between the second terminal of the first transistor and the second terminal of the second transistor. The first transistor may be connected to the third transistor in a current mirror configuration.

The differential amplification section may have third and fourth transistor of the second conductivity type, fifth and sixth transistors of the first conductivity type, and a constant current source, the first terminals of the third and fourth transistors being connected to the second power source unit through the constant current source, the control terminals of the third and fourth transistors receiving first and second inputs, respectively, the first terminals of the fifth and sixth transistors being connected to the first power source unit, the control terminals of the fifth and sixth transistor as well as to the second terminal of the third transistor, the output of the differential amplification section being provided from a node between the second terminal of the sixth transistor and the second terminal of the fourth transistor.

In the output section, the first terminal of the first transistor may be connected to the first power source unit, the control terminal of the first transistor may be connected to the output of the differential amplification section, the first terminal of the second transistor may be connected to the second power source unit, the control terminal of the second transistor may be connected to the output of the drive control unit, and a node between the second terminal of the first transistor and the second terminal of the second transistor may provide the output of the operational amplifier.

The first conductivity type may be a P-channel type, the second conductivity type may be an N-channel type, the transistors may be MIS transistors, the first terminal may be a source, the second terminal may be a drain, and the control terminal may be a gate. The first conductivity type may be a PNP type, the second conductivity type may be an NPN type, the transistors may be bipolar transistors, the first terminal may be an emitter, the second terminal may be a collector, and the control terminal may be a base. The operational amplifier may constitute a semiconductor integrated circuit.

According to a second aspect of the present invention, there is provided a current detector circuit comprising a first detecting object; a first current detector for detecting a current flowing through the first detecting object; a second detecting object; a second current detector for detecting a current flowing through the second detecting object; and a monitor including a first transistor having a control terminal connected to an output of the first current detector and a second transistor having a second terminal connected to a first terminal of the first transistor and a control terminal connected to an output of the second current detector, the first and second transistors having identical characteristics.

The first detecting object may have a third transistor. The first current detector may include a fourth transistor having a control terminal connected to a control terminal of the third transistor; and a fifth transistor having second and control terminals connected to a second terminal of the fourth transistor and to the control terminal of the first transistor.

The current detector circuit may further comprise a first current source connected to a second terminal of the first transistor; and a feedback circuit for fixing currents flowing through the first and second detecting objects in response to a signal from the second terminal of the first transistor.

The monitor may include a sixth transistor having a second terminal connected to the second terminal of the first transistor and a control terminal connected to the control terminal of the second transistor; and a seventh transistor having a control terminal connected to the control transistor having a control terminal connected to the control terminal of the first transistor and a second terminal connected to a first terminal of the sixth transistor. The first, second, fifth, sixth, and seventh transistors may be made of a first conductivity type, and the third and fourth transistors are made of a second conductivity type.

The first terminal may be a source, the second terminal may be a drain, and the control terminal may be a gate. The first terminal may be an emitter, the second terminal may be a collector, and the control terminal may be a base. The current detector circuit may constitute an operational amplifier, or a semiconductor integrated circuit.

BRIEF DESCRIPTION OF THE DRAWINGS

The present invention will be more clearly understood from the description of the preferred embodiments as set forth below with reference to the accompanying drawings, wherein:

FIGS. 9A, 9B, and 9C are diagrams for explaining the operation of the first prior art shown in FIG. 8, in which FIG.

9A is a table showing the input and output of a differential amplifier section of the amplifier, FIG. 9B shows differential inputs V+ and V− and currents at different parts, and FIG. 9C shows differential inputs V+ and V− and currents I1 and I2 at different parts;

FIGS. 10A and 10B shows an AB-class amplifier according to a still another prior art, in which FIG. 10A is a circuit diagram generally showing the amplifier, and FIG. 10B is a circuit diagram showing a feedback system (current detector circuit) of the amplifier;

FIGS. 11A and 11B are diagrams for explaining a principle of a current detector circuit according to a second aspect of the present invention, in which FIG. 11A is a general view and FIG. 11B is a circuit diagram showing a modification of a monitor;

FIGS. 15A and 15B show an AB-class amplifier according to the second aspect of the present invention, in which FIG. 15A is a circuit diagram generally showing the amplifier, and FIG. 15B is a circuit diagram showing a current detector circuit of the amplifier;

FIGS. 19A and 19B are diagrams for explaining the operation of the third embodiment, in which FIG. 19A shows current values at different parts under a normal operation, and FIG. 19B shows current values at the parts when a digital input signal Dk fails.

DESCRIPTION OF THE PREFERRED EMBODIMENTS

For a better understanding of the preferred embodiments, the problems of an operational amplifier according to the prior art will be explained, with reference to FIGS. 1 and 2.

Figure 1:
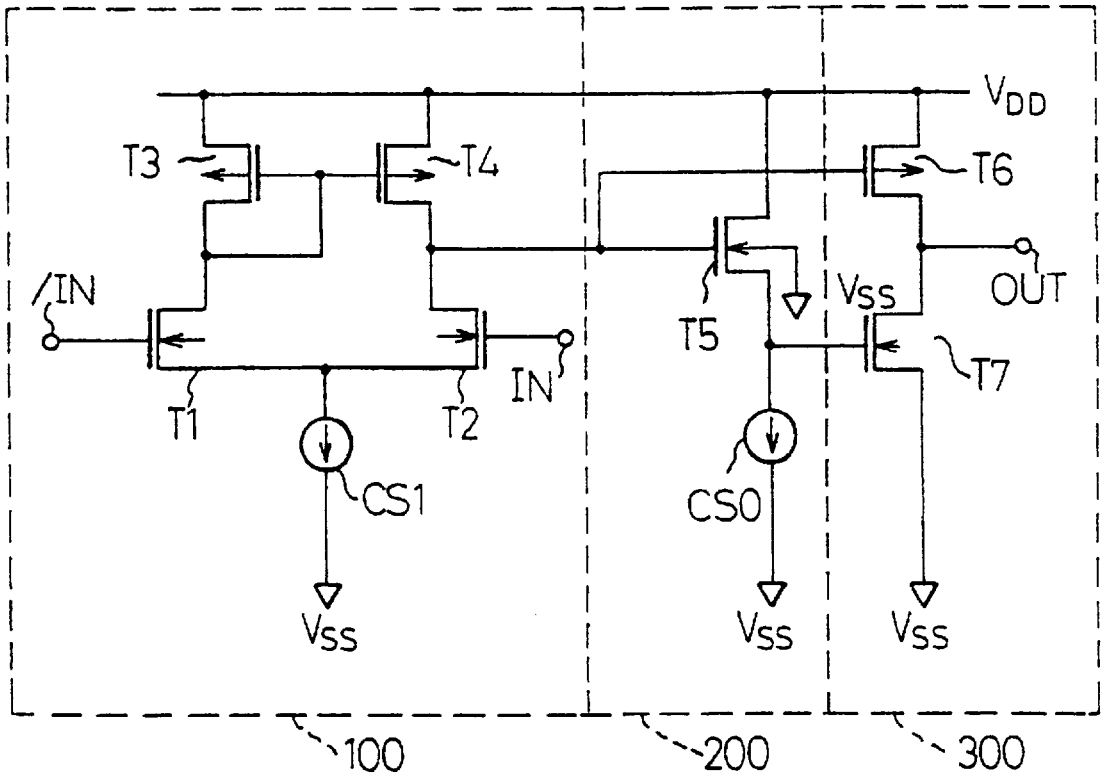
Fig. 1 (Prior Art)
FIG. 1 is a circuit diagram showing an operational amplifier according to a prior art.

FIG. 1 is a circuit diagram showing an operational amplifier according to a prior art. The operational amplifier consists of a differential amplification section 100, a level shift section 200, and an output section 300. The operational amplifier includes a high-potential power source line (first power source means) $V_{DD}$ and a low-potential (ground level) power source line (second power source means) Vss.

The differential amplification section 100 has N-channel MOS transistors T1 and T2, P-channel MOS transistors T3 and T4, and a constant current source CS1. The gate of the transistor T1 receives a signal input from an inverting input/IN, and the gate of the transistor T2 receives a signal input from a non-inverting input IN. A node between the transistors T2 and T4 provides the output of the differential amplification section 100, which is supplied to the level shift section 200.

The level shift section 200 has an N-channel MOS transistor T5 and a constant current source CS0. The output section 300 has a P-channel MOS transistor T6 and an N-channel MOS transistor T7. The transistors T6 and T7 form a push-pull circuit. The gate of the transistor T6 receives the output of the differential amplification section 100. The gate of the transistor T7 receives a level-shifted output from the level shift section 200 through a node between the source of the transistor T5 and the constant current source CS0. The back gate (substrate) of the transistor T5 receives the low-potential (ground level) source voltage Vss.

According to the operation amplifier of FIG. 1, the level shift section 200 shifts the level of an output signal in response to a fluctuation in the source voltage $V_{DD}$. The amount of the shift, however, does not correctly follow the fluctuation in the source voltage $V_{DD}$. This results in fluctuating a bias voltage (a gate-source voltage VGS minus a threshold voltage Vth) of each of the transistors T6 and T7 of the output section 300, to thereby change currents passing through the transistors T6 and T7 and fluctuate the power source current and other characteristics of the operational amplifier. Namely, the bias voltage is changed in response to the source voltage $V_{DD}$.

The bias voltage of the transistor T7 is changed when the source voltage $V_{DD}$ varies. This change is fed back to the transistor T6 that forms the push-pull circuit with the transistor T7, to thereby shift the bias voltage of the transistor T6.

Figure 2:
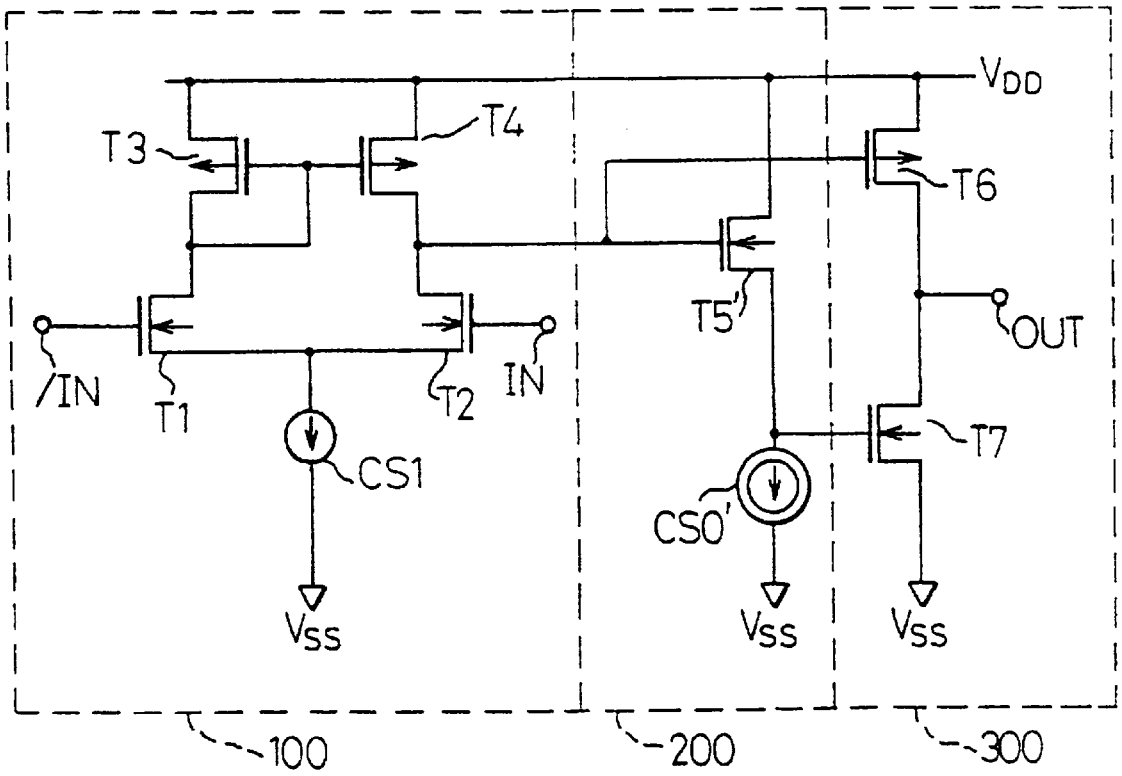
Fig. 2 (Prior Art)
FIG. 2 is a circuit diagram showing an operational amplifier according to another prior art.

FIG. 2 is a circuit diagram showing an operational amplifier according to another prior art. This is an improvement of the operational amplifier of FIG. 1 and is disclosed in Japanese Unexamined Patent Publication (Kokai) No. 1-137808.

The operational amplifier of FIG. 2 has a level shift section 200 having an N-channel MOS transistor T5' and a current source CS0', which changes a current in response to a fluctuation in a source voltage. This operational amplifier has a differential amplification section 100 and an output section 300, which are the same as those of the operational amplifier of FIG. 1.

The operational amplifier of FIG. 2 is capable of maintaining the bias voltages of transistors T6 and T7 that form a push-pull circuit, with respect to a fluctuation of, for example, ±5% in a source voltage of 5 V. This operational amplifier, however, is incapable of stabilizing operation for a wide range of source voltages, for example, from 3 V to 5 V. To deal with a fluctuation in a bias voltage, the operation point of the output section 300 is usually of class A or AB. It is, therefore, difficult to reduce power consumption. If the operation point of the output section 300 is of class B, the transistors T6 and T7 may be cut off due to a fluctuation in a bias voltage, to thereby cause distortion.

Below, embodiments of an operational amplifier according to a first aspect of the present invention will be explained with reference to FIGS. 3 to 7.

Figure 3:
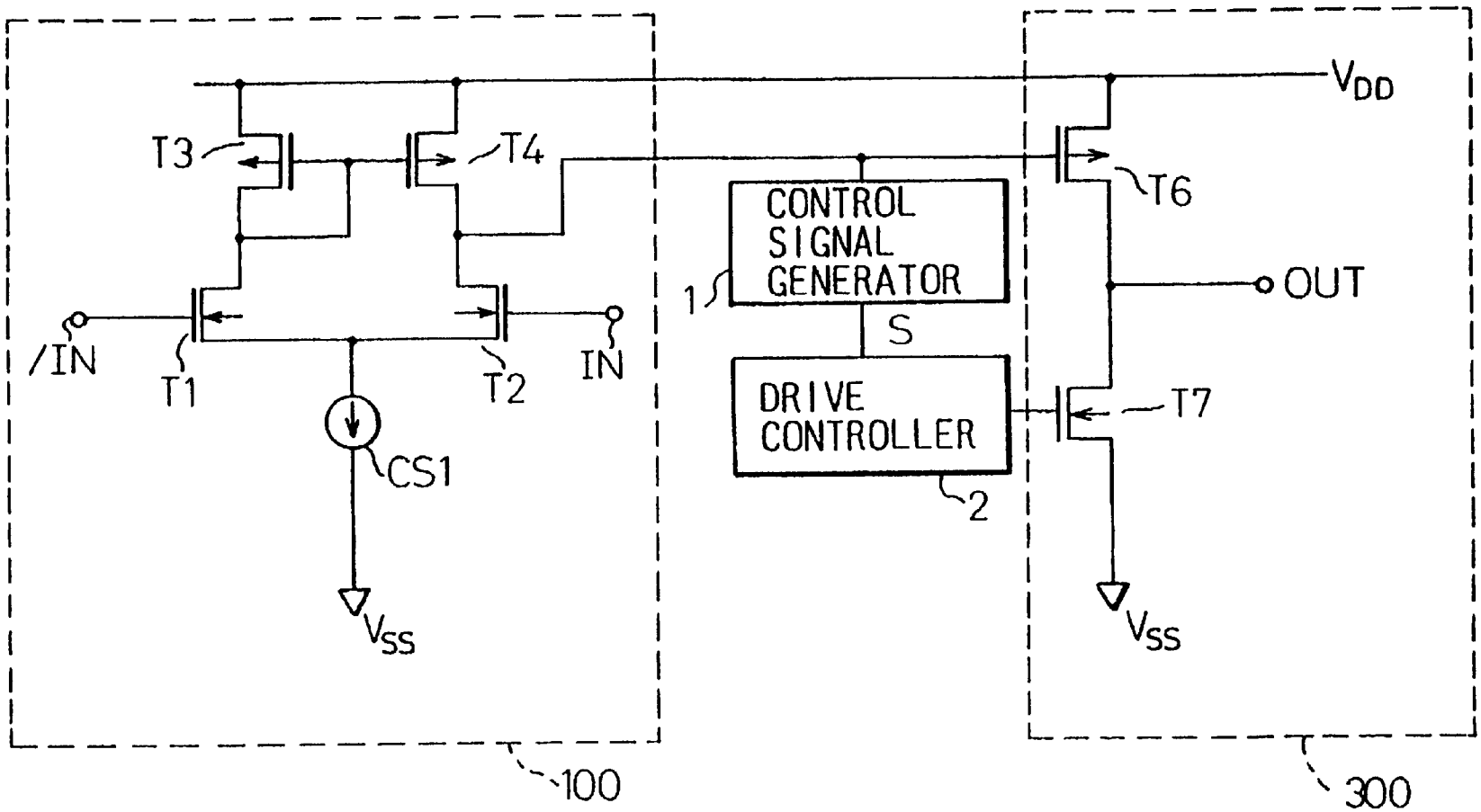
FIG. 3 is a block diagram showing a principle of an operational amplifier according to a first aspect of the present invention.

FIG. 3 is a block diagram showing the principle of an operational amplifier according to a first aspect of the present invention.

As shown in FIG. 3, the operational amplifier has a differential amplification section 100 and an output section 300. The output section 300 has a first transistor T6 of first conductivity type and a second transistor T7 of second conductivity type that is opposite to the first conductivity type. The transistors T6 and T7 are connected in series between a first power source $V_{DD}$ and a second power source Vss. The first transistor T6 is driven according to the output of the differential amplification section 100.

The amplifier also has a control signal generator 1 for detecting a current flowing through the first transistor T6 and generating a control signal S in response to the detected current, and a drive controller 2 for driving the second transistor T7 in response to the control signal S.

The output section 300 of the operational amplifier of the present invention has the first transistor T6 of first conductivity type and the second transistor T7 of second conductivity type that is opposite to the first conductivity type. The transistors T6 and T7 are connected in series between the first and second power sources $V_{DD}$ and Vss. The control signal generator 1 detects a current flowing through the first transistor T6 and generates a control signal S in response to the detected current. The drive controller 2 drives the second transistor T7 in response to the control signal S. The first and second transistors T6 and T7 form a push-pull circuit.

The control signal S generated by the control signal generator 1 is proportional to a current flowing through the first transistor T6. The drive controller 2 receives the control signal S, detects a decrease in the control signal S, and drives the second transistor T7. In this way, the operational amplifier of the present invention detects a current flowing through the first transistor T6, and if there is a decrease in the current flowing through the first transistor T6, increases a current flowing through the second transistor T7. Even if a source voltage fluctuates, a current flowing through the second transistor T7 will be unchanged to provide stable operation independent of a source voltage.

In this way, the operational amplifier of the present invention stably operates for a wide range of source voltages.

Figure 4:
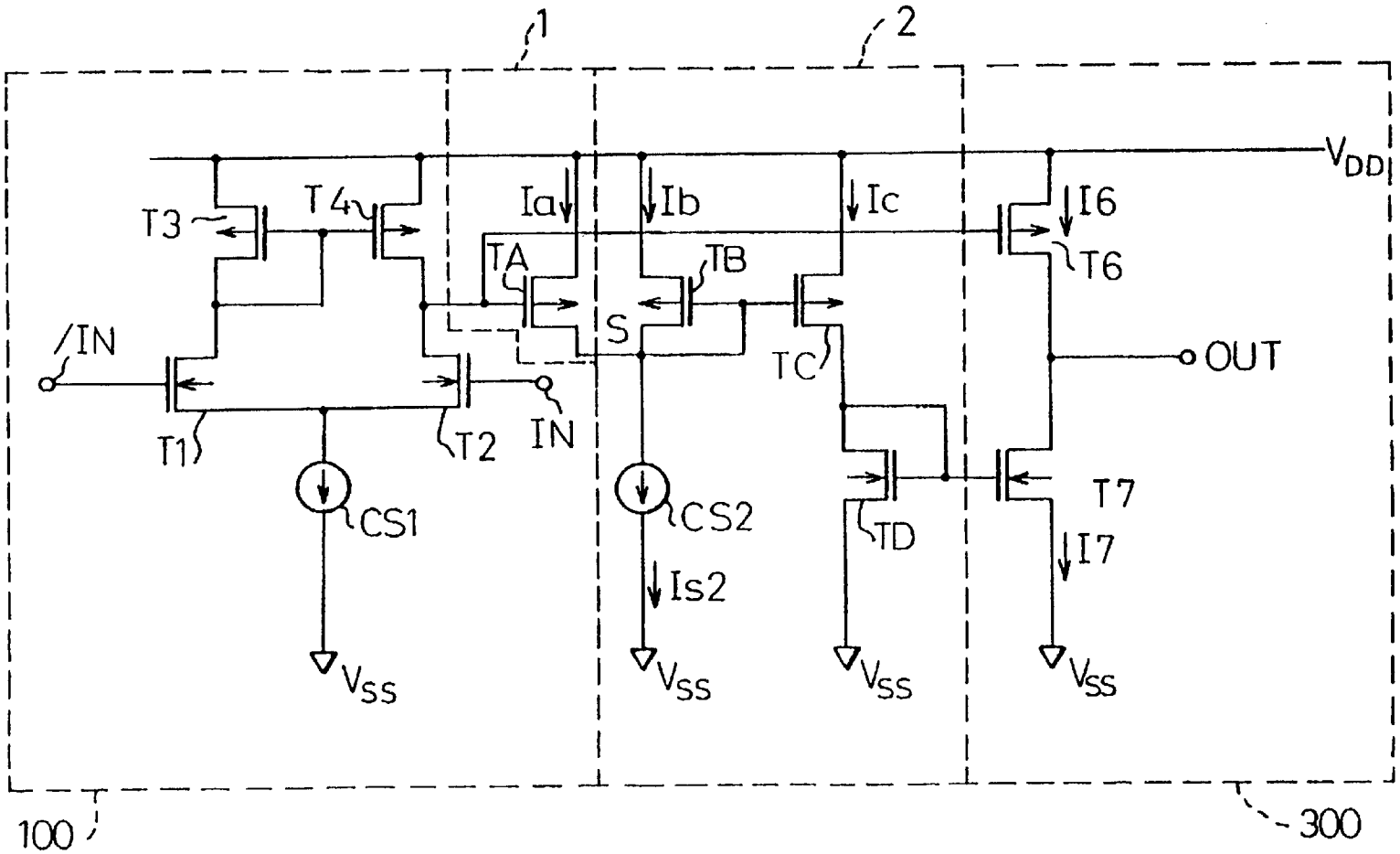
FIG. 4 is a circuit diagram showing an operational amplifier according to the first embodiment of the first aspect of the present invention.

FIG. 4 is a circuit diagram showing an operational amplifier according to the first embodiment of the first aspect of the present invention. The operational amplifier consists of a control signal generator 1, a drive controller 2, a differential amplification section 100, and an output section 300. The differential amplification section 100 and output section 300 are the same as those of the prior arts of FIGS. 1 and 2. The operational amplifier includes a high-potential power source line (first power source means) $V_{DD}$ and a low-potential (ground level) power source line (second power source means) Vss.

The differential amplification section 100 has N-channel MOS transistors T1 and T2, P-channel MOS transistors T3 and T4, and a constant current source CS1. The gate of the transistor T1 is connected to an inverting input/IN, and the gate of the transistor T2 is connected to a non-inverting input (positive logic input) IN. A node between the transistors T2 and T4 provides the output of the differential amplification section 100. An end of the constant current source CS1 is connected to the source of the transistor T1 and the source of the transistor T2. The other end of the constant current source CS1 is connected to the low-potential power source line Vss.

The output section 300 has two transistors T6 and T7 connected in series between the high-potential power source line $V_{DD}$ and the low-potential power source line Vss, the form a push-pull circuit. The transistor T6 is a P-channel MOS transistor having a source connected to the power source line $V_{DD}$, and the transistor T7 is an N-channel MOS transistor having a source connected to the power source line Vss. A node between the drain of the transistor T6 and the drain of the transistor T7 provides the output OUT of the operational amplifier.

The control signal generator 1 has a P-channel MOS transistor TA having a source connected to the high-potential power source line $V_{DD}$. The gate of the transistor TA is connected to the gate of the transistor T6 of the output section 300, which receives the output of the differential amplification section 100. Namely, the transistors TA and T6 are connected to each other in a current mirror configuration. A current Ia flowing through the transistor TA is proportional to a current I6 flowing through the transistor T6, i.e., Ia=k1*I6. Hence, k1 to k7 are constants.

The drive controller 2 has P-channel MOS transistors TB and TC having sources connected to the high-potential power source line $V_{DD}$, an N-channel MOS transistor TD having a gate and drain connected to the drain of the transistor TC, and a constant current source CS2. The gate and drain of the transistor TB are connected to the low-potential power source line Vss through the constant current source CS2, to the gate of the transistor TC, and to the drain of the transistor TA of the control signal generator 1, to receive a control signal S from the control signal generator 1. The transistors TB and TC are connected to each other in a current mirror configuration. A current Ib flowing through the transistor TB is proportional to a current Ic flowing through the transistor TC, i.e., Ic=k2*Ib.

The transistor TA of the control signal generator 1 generates the control signal S proportional to a current flowing through the transistor T6 of the output section 300. The signal S corresponds to the current Ia flowing through the transistor TA. The drive controller 2 receives the signal S, detects a decrease in the signal S (current Ia), and drives the transistor T7 of the output section 300 accordingly. The transistor TD and the transistor T7 of the output section 300 are connected to each other in a current mirror configuration, so that a current I7 flowing through the transistor T7 is proportional to the current Ic flowing through the transistor TD, i.e., I7=k3*Ic.

As explained above, the current Ia (control signal S) flowing through the transistor TA is proportional to the current I6 flowing through the transistor T6, the current Ib flowing through the transistor TB is proportional to the current Ic flowing through the transistor TC, and the current Ic is proportional to the current I7 flowing through the transistor T7.

Namely, Ia=k1*I6, Ic=k2*Ib, and I7=k3*Ic. Ia+Ib=Is2 (constant), so that I7+k3*k2*(Is2−k1*I6)=k3*k2*(Is2−k1)*k2*k3*I6. Here, k1, k2, and k3 are constants determined according to the physical sizes of the transistors, and therefore, are independent of a source voltage. Accordingly, the amplitude of the current I7 flowing through the transistor T7 is independent of the source voltage.

In this way, the current I6 flowing through the transistor T6 of the output section 300 is indirectly detected by the transistor TA connected to the transistor T6 in a current mirror configuration, and the transistor TA generates the control signal S accordingly. The control signal S is supplied to the drive controller 2 which increases a control voltage to the gate of the other transistor T7 of the output section 300 if the current flowing through the transistor T6 decreases, to thereby increase a current passing through the transistor T7.

When the current passing through the transistor T6 increases, the drive controller 2 drops the control voltage to the gate of the transistor T7 of the output section 300, to thereby decrease the current I7 passing through the transistor T7. This embodiment establishes a relationship of I7≦k2*k3*Is2, to provide a current limit function on sink current. In this way, the operational amplifier of the first embodiment stably operates for a wide range of source voltages.

Figure 5:
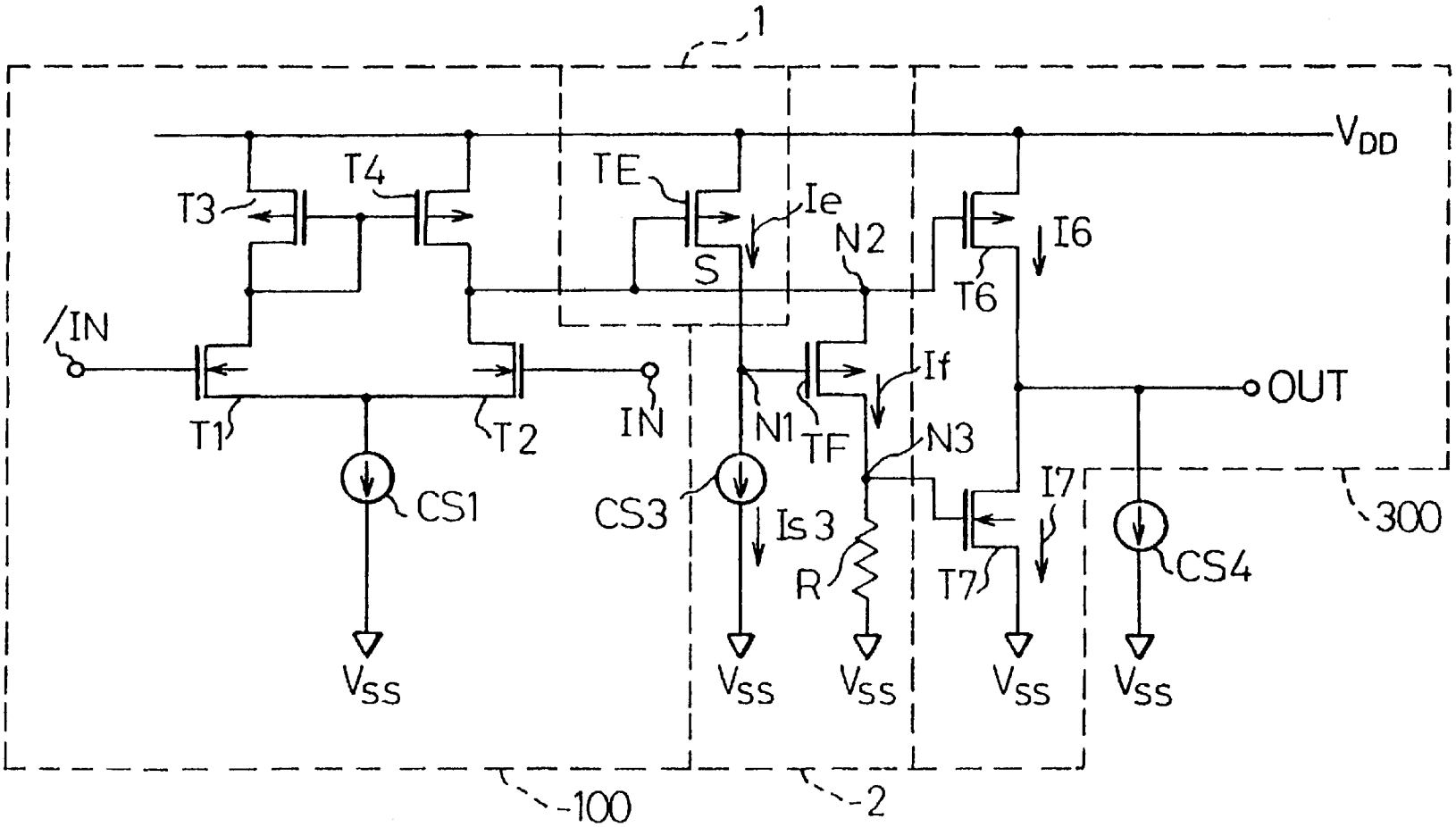
FIG. 5 is a circuit diagram showing an operational amplifier according to a second embodiment of the first aspect of the present invention.

FIG. 5 is a circuit diagram showing an operational amplifier according to a second embodiment of the first aspect of the present invention. This operational amplifier has a differential amplification section 100 having transistors T1 to T4 and an output section 300 having transistors T6 and T7. These sections 100 and 300 are the same as those of the first embodiment of FIG. 4 and of the prior arts of FIGS. 1 and 2.

A control signal generator 1 has a P-channel MOS transistor TE having a source connected to a high-potential power source line $V_{DD}$. A drive controller 2 has a resistor (load means) R, a P-channel MOS transistor TF having a drain connected to a low-potential power source line Vss through the resistor R, and a constant current source CS3. The output of the differential amplification section 100 is connected to the gate of the transistor T6 of the output section 300, the gate of the transistor TE of the control signal generator 1, and the source of the transistor TF of the drive controller 2. The drain of the transistor TE is connected to the gate of the transistor TF and to the power source line Vss through the constant current source CS3. 10 A node between the drain of the transistor TF and the resistor R provides the output of the drive controller 2, which is connected to the gate of the transistor T7 of the output section 300. The transistor TE of the control signal generator 1 is connected to the transistor T6 of the output section 300 in a current mirror configuration, so that a current Ie passing through the transistor TE is proportional to a current I6 passing through the transistor T6, i.e., Ie=k4*I6.

According to the second embodiment, the current Ie (control signal S) passing through the transistor TE is proportional to the current I6 passing through the transistor T6, so that Ie=k4*I6. When Ie>Is3, a voltage v1 at a node N1 at the drain of the transistor TE, the gate of the transistor TF, and an end of the constant current source CS3 is as high as the source voltage $V_{DD}$. Accordingly, the transistor TF is OFF, and a voltage V3 at a node N3 among the drain of the transistor TF, the gate of the transistor T7, and an end of the resistor R is low. Consequently, the transistor T7 of the output section 300 is OFF and passes no current.

When I6<Is3/k4, i.e., when Ie<Is2 to make V1<V2−Vth (TF), the transistor TF passes a current If to increase the voltage V3 at the node N3, to thereby increase a voltage drop due to the resistor R. As a result, the other transistor T7 of the output section 300 passes a current I7. Here, the reference mark V2 is a voltage at a node N2, i.e., the output voltage of the differential amplifier 100, and Vth(TF) is the threshold voltage of the transistor TF.

The above operation is independent of the magnitude of a source voltage, and therefore, the current I7 flowing through the transistor T7 is independent of the source voltage. According to the embodiment of FIG. 5, a constant current source CS4 is inserted between the output OUT of the operational amplifier and the low-potential power source line Vss. The constant current source CS4 passes a current corresponding to the current I6 flowing through the transistor T6 at a usual operation point (V+IN=V−IN), and draws a current from the output OUT of the operational amplifier when the transistor T7 is OFF.

In this way, the second embodiment indirectly detects the current I6 passing through the transistor T6 of the output section 300, using the transistor TE of the control signal generator 1 connected to the transistor T6 in a current mirror configuration, and generates the control signal S. The control signal S is supplied to the drive controller 2, so that, when the current flowing through the transistor T6 decreases to below a predetermined value, the other transistor T7 of the output section 300 is turned ON to pass the current I7 through the transistor T7. When the current flowing through the transistor T6 is above the predetermined value, the transistor T7 is kept OFF and passes no current. Accordingly, the operational amplifier of the second embodiment stably operates for a wide range of source voltages.

Figure 6:
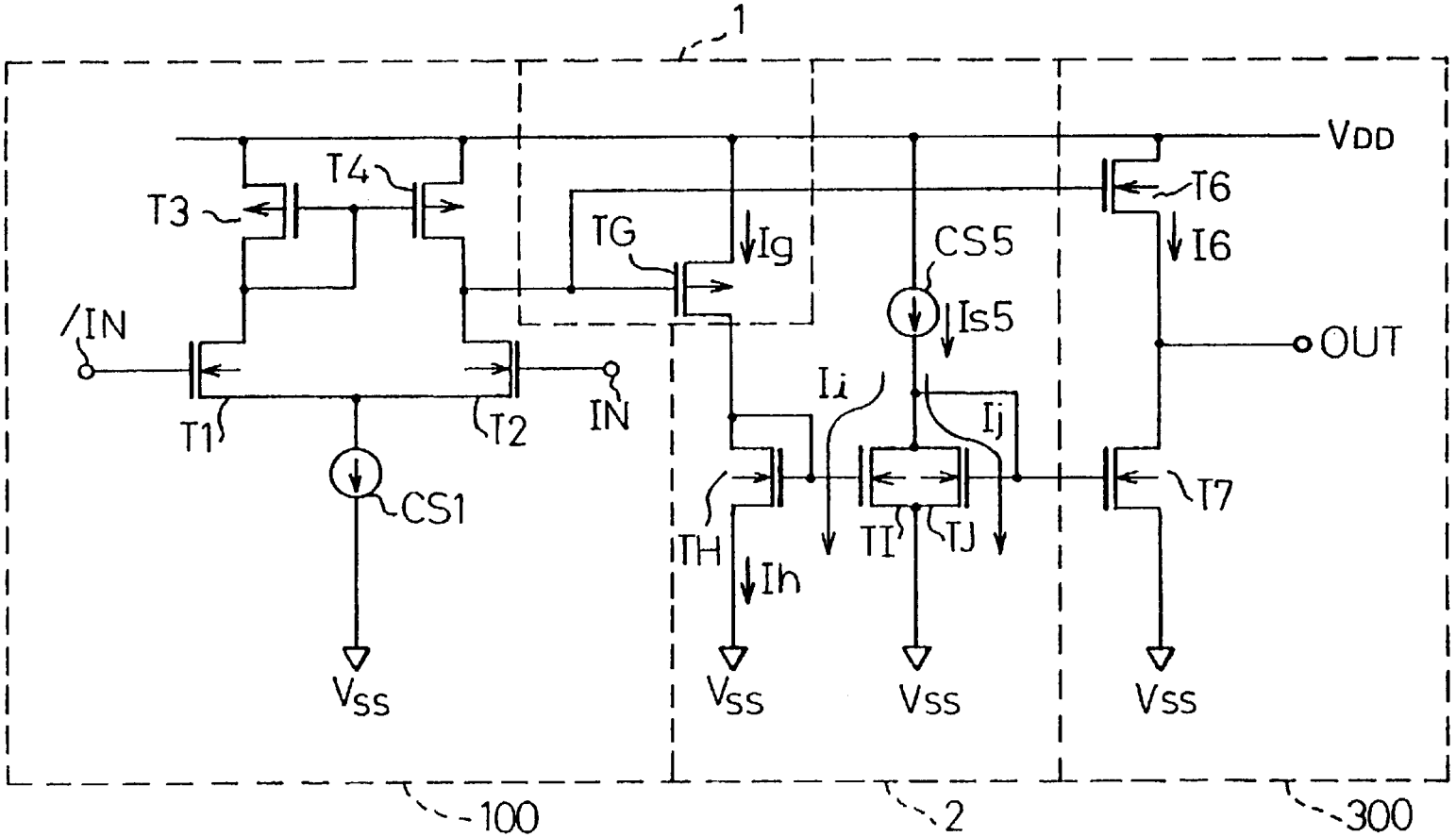
FIG. 6 is a circuit diagram showing an operational amplifier according to a third embodiment of the first aspect of the present invention.

FIG. 6 is a circuit diagram showing an operational amplifier according to a third embodiment of the first aspect of the present invention. This operational amplifier has a differential amplification section 100 including transistors T1 to T4 and an output section 300 including transistors T6 and T7. These sections 100 and 300 are the same as those of the operational amplifiers mentioned above.

According to the third embodiment of FIG. 6, a control signal generator 1 has a P-channel MOS transistor TG having a source connected to a high-potential power source line $V_{DD}$. A drive controller 2 has N-channel MOS transistors TH, TI, and TJ having sources connected to a low-potential power source line Vss, and a constant current source CS5.

The output of the differential amplification section 100 is supplied to the gate of the transistor T6 of the output stage 300 and the gate of the transistor TG of the control signal generator 1. The drain of the transistor TG is connected to the gate and drain of the transistor TH and the gate of the transistor TI. An end of the constant current source CS5 is connected to the power source line $V_{DD}$, and the other end of the constant current source CS5 is connected to the drain of the transistor TI, the drain and gate of the transistor TJ, and the gate of the transistor T7.

The transistors TG and T6 are connected to each other in a current mirror configuration, so that a current Ig passing through the transistor TG is proportional to a current I6 passing through the transistor T6, i.e., Ig=k5*I6. The transistors TH and TI are connected to each other in a current mirror configuration, so that a current Ii passing through the transistor TI is proportional to a current Ih passing through the transistor TH, i.e., Ii=k6*Ih.

The transistors TJ and T7 are connected to each other in a current mirror configuration, so that a current I7 passing through the transistor T7 is proportional to a current Ij passing through the transistor Tj, i.e., I7=k7*Ij.

In this way, the current I6 passing through the transistor T6 is proportional to the current Ig passing through the transistor TG, the current Ih passing through the transistor TH is proportional to the current Ii passing through the transistor TI, and the current Ij passing through the transistor TJ is proportional to the current I7 passing through the transistor T7. Namely, Ig=k5*I6, Ii=k6*Ih, and I7=k7*Ij. Ii+Ij=Is5 (constant), and therefore, I7=k7*(Is5−k5*k6*I6)=K7*Is5−k5*K6*k7*I6. Here k5 to k7 are constants. Accordingly, the current I7 passing through the transistor T7 is independent of the source voltage.

The third embodiment employs the transistor TG (control signal generator 1) connected to the transistor T6 in a current mirror configuration, to indirectly detect the current I6 passing through the transistor T6 of the output section 300 and generate the control signal S. The control signal S is supplied to the drive controller 2 so that, when the current passing through the transistor T6 decreases, a control voltage supplied to the gate of the transistor T7 of the output section 300 is increased to increase the current I7 passing through the transistor T7.

When the current passing through the transistor T6 increases, the control voltage applied to the gate of the other transistor T7 is decreased to decrease the current I7 passing through the transistor T7. According to the third embodiment, I7≦k7*Is5, to realize a current limit function on a sink current. As explained above, the operational amplifier according to the third embodiment stably operates for a wide range of source voltages.

Figure 7:
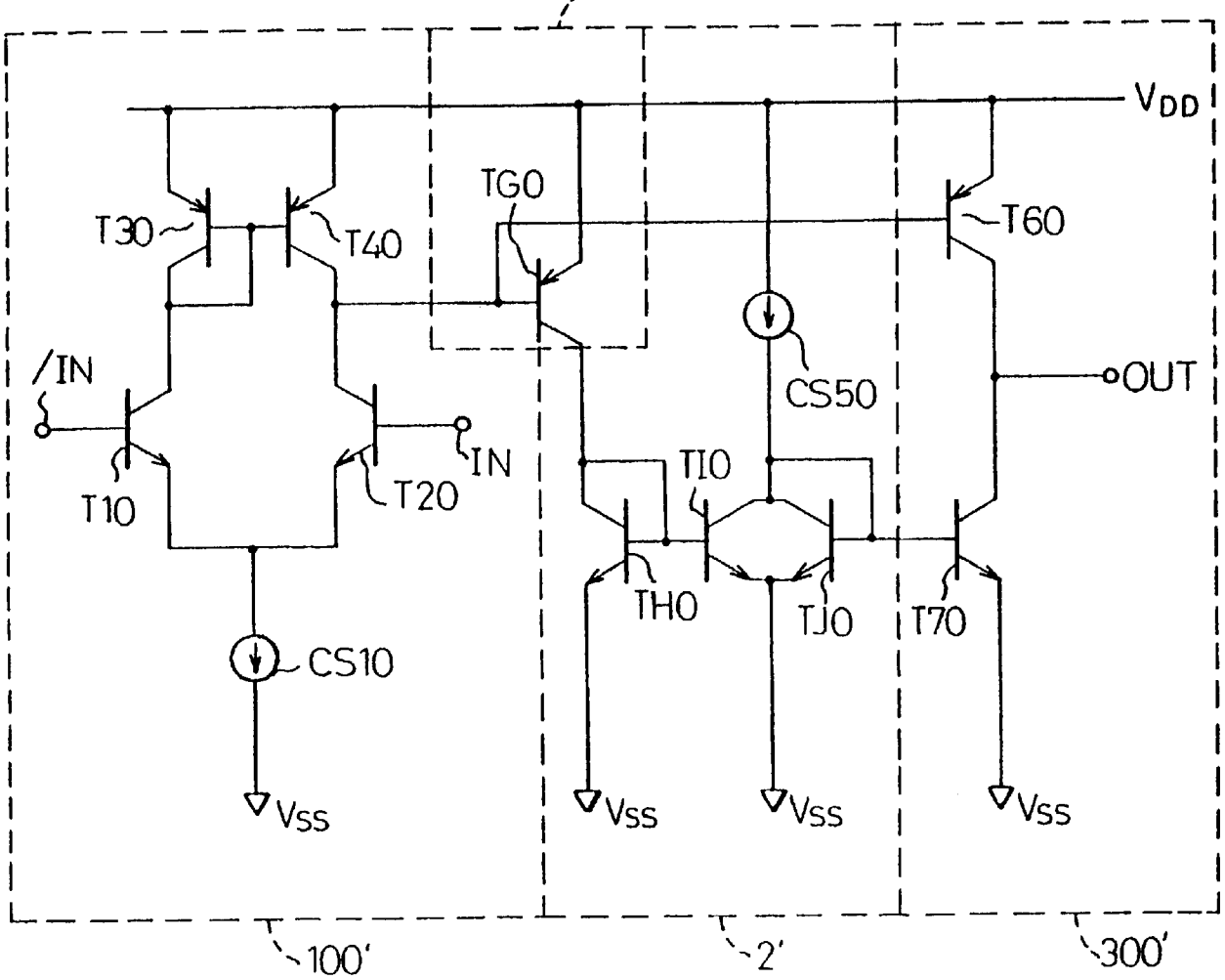
FIG. 7 is a circuit diagram showing an operational amplifier according to a fourth embodiment of the first aspect of the present invention.

FIG. 7 is a circuit diagram showing a modification of the operational amplifier of FIG. 6. This modification employs PNP bipolar transistors instead of the P-channel MOS transistors of FIG. 6, and NPN bipolar transistors instead of the N-channel MOS transistors of FIG. 6.

The operational amplifier of FIG. 7 has a differential amplification section 100' and an output section 300' corresponding to the differential amplification section 100 and output section 300 of FIG. 6. The bipolar transistors T10 to T40, T60, and T70 and a constant current source CS10 correspond to the MOS transistors T1 to T4, and T7 and constant current source CS1 of FIG. 6. The bipolar transistor TG0 of a control signal generator 1', the bipolar transistors TH0, TI0, TJ0 and a constant current source CS50 of a drive controller 2' correspond to the MOS transistor TG, MOS transistors TH, TI, and TJ, and constant current source CS5 of FIG. 6.

The operational amplifiers of the embodiments mentioned above may be made not only of MOS (MIS) transistors but may also be bipolar transistors or other devices. Further, the above described operational amplifiers can be constituted as semiconductor integrated circuits.

As explained above, an operational amplifier according to the present invention is capable of securing the performance thereof for a wide range of source voltages.

Next, a second aspect of the present invention will be explained. First, problems of a current detector circuit of the prior art will be explained.

Figure 8:
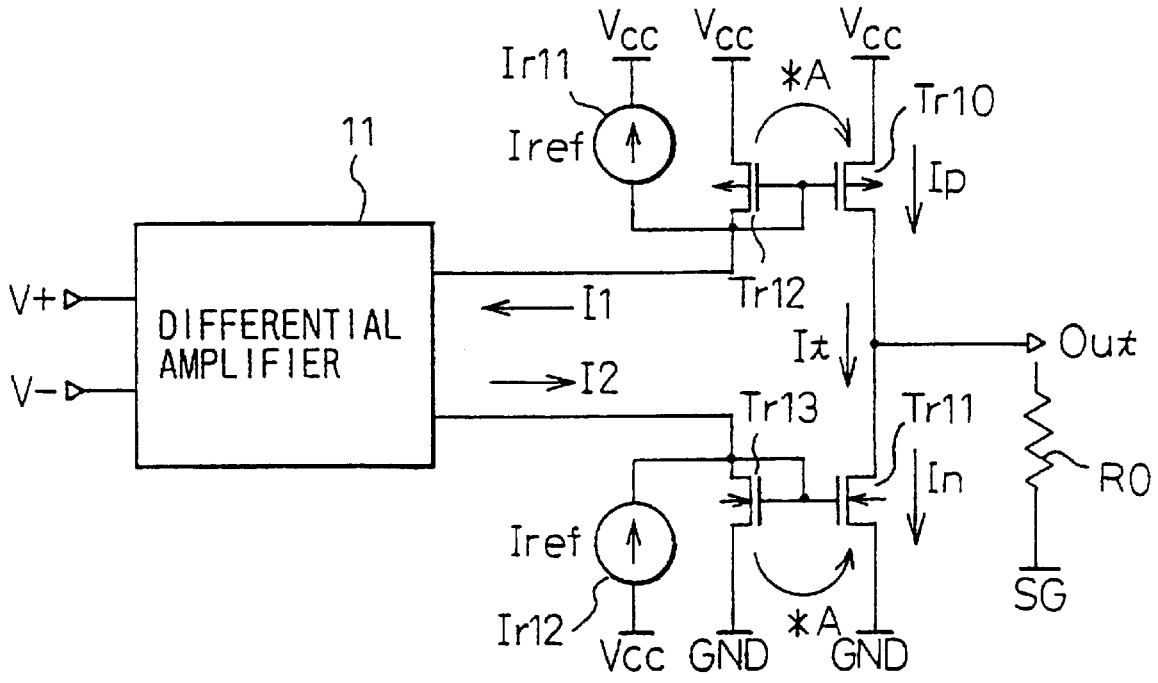
Fig.8 (Prior Art)
FIG. 8 is a circuit diagram showing an AB-class amplifier according to another prior art.

FIG. 8 shows an AB-class amplifier according to a first prior art.

The amplifier has a differential amplifier I1, constant current sources Ir11 and Ir12 each for supplying a current Iref, P-channel transistors Tr10 and Tr12, and N-channel transistors Tr11 and Tr13.

FIGS. 9A, 9B, and 9C are diagrams for explaining the operation of the first prior art shown in FIG. 8.

FIG. 9A is a table showing input and output levels V+ and V− and converted currents I1 and I2 of the differential amplifier 11. In the table, a reference mark G is the gain of the differential amplifier, and "*" is a multiplication operator used through this specification and accompanying drawings, in the following descriptions.

FIG. 9B shows relationships between the differential inputs V+ and V1 and currents at different parts including a current Ip flowing through the P-channel transistor Tr10, a current In flowing through the N-channel transistor Tr11, and a weak through current (weak flowing current) It flowing to an output section of the amplifier. The through current It is the smaller of the currents Ip and In.

FIG. 9C shows relationships between the differential inputs V+ and V− and the currents I1 and I2.

The through current It is necessary to cancel a crossover distortion. The through current must be as small as possible The first prior art is advantageous because it is simple. It, however, has a problem of large power consumption to keep the through current It above 0 because the through current It varies in response to a change in the characteristics of the transistors.

Figure 10A:
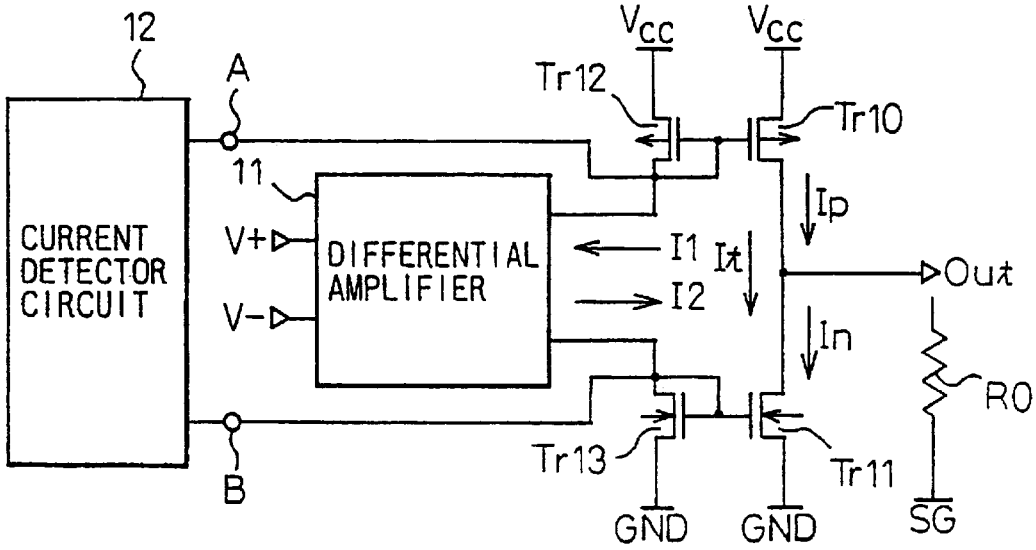
Fig.10A (Prior Art)
Figure 10B:
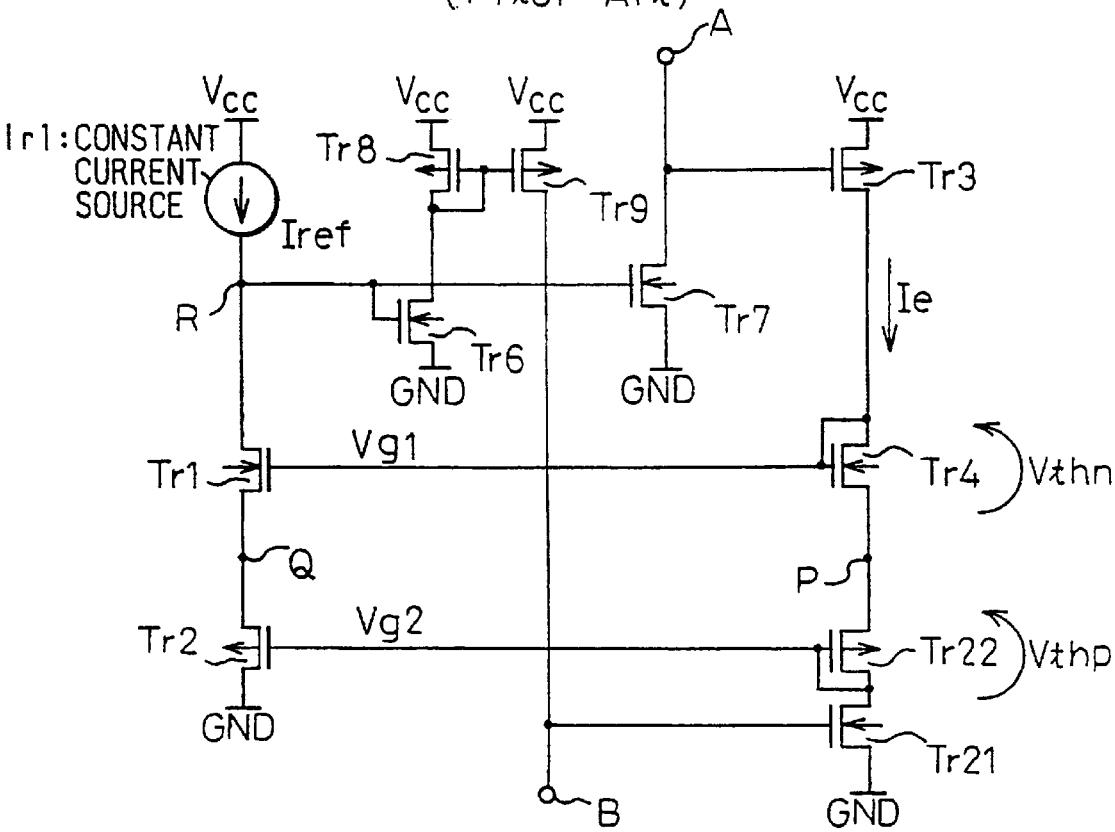
Fig.10B (Prior Art)

To solve this problem, an AB-class amplifier of FIGS. 10A and 10B according to a second prior art has been proposed. FIG. 10A is a circuit diagram generally showing the amplifier and FIG. 10B is a circuit diagram showing a feedback system (a current detector circuit) in the amplifier.

In FIG. 10A, the amplifier of the second prior art has a differential amplifier 11, the current detector circuit 12, P-channel transistors Tr10 and Tr12, and N-channel transistors TrI1 and TrI3.

In FIG. 10B, the current detector circuit 12 has a constant current source Ir1 for supplying a current Iref, P-channel transistors Tr2, Tr3, Tr8, Tr9, and Tr22, and N-channel transistors Tr1, Tr4, Tr6, Tr7, and Tr21.

The feedback system (current detector circuit) carries out a negative feedback operation to supply a constant through current (constant flowing current) It to an output section (transistors Tr10 and Tr11) in the amplifier.

The operation of the AB-class amplifier of the second prior art will be explained. The size of a transistor is defined as follows:

$$Tr2/Tr1=X$$

Namely, the ratio of the size of a transistor Tr1 to that of a transistor Tr2 is X.

The drain current of a transistor is proportional to the size of the transistor. When the transistors Tr1 and Tr2 are connected to each other in a current mirror configuration, a current flowing through the transistor Tr2 is X times a current flowing through the transistor Tr1.

(i) Input

Relationships between differential inputs V+ and V− and currents I1 and I2 are the same as those of the first prior art of FIG. 9A.

(ii) Current detection

The current detector circuit of FIG. 10B detects the through current It by the transistors Tr1 to Tr4, Tr21, and Tr22. The detecting operation will be explained.

The sizes of the transistors are as follows:

$$Tr10/Tr3=Tr11/Tr21=S \quad (1)$$

$$Tr4/Tr1=Tr22/Tr2=T \quad (2)$$

A current Ie is as follows:

$$Ie=(1/S)*It \quad (3)$$

Namely, the current Ie is proportional to the through current It. The transistors Tr4 and Tr22 operate in a saturation region, so that the following expressions are established:

$$I(Tr4)=\beta(Vg1-Vp-Vthn)^2/2 \quad (4)$$

$$I(Tr22)=\beta(Vp-Vg2-|Vthp|)^2/2 \quad (5)$$

$$I(Tr4)=I(Tr22) \quad (6)$$

where Vp is a voltage at a node P, Vg1 and Vg2 are the gate voltages of the transistors Tr1 and Tr2, respectively, and Vthn and Vthp are the threshold voltages of N- and P-channel transistors, respectively.

Accordingly, the voltages Vg1, Vt2, and Vp are uniquely determined according to the expressions (4) to (6).

At this time, the following is established:

$$Vp=Vq \quad (7)$$

where Vq is a voltage at a node Q. This is because the expressions (4) to (6) are applicable to each of the transistors Tr1 and Tr2 and the voltages Vg1 and Vg2 are common to the transistors.

$$I(Tr1)=I(Tr2)=(1/T)*Ie \quad (8)$$

According to the expressions (3) and (8), the following is established:

$$I(Tr1)=I(Tr2)=(1/S*T)*It \quad (9)$$

Namely, the transistors Tr1 and Tr2 detect the through current It.

(iii) General operation

As explained in (2), a current flowing through the transistors Tr1 and Tr2 is (1/S*T)*It, so that the current follows the through current (flowing current) It.

If the current It decreases due to some reason, a voltage Vr at a node R increases. This is because the current flowing through the transistors Tr1 and Tr2 is kept constant by the constant current source Ir1 connected in series.

When the voltage Vr increases, currents flowing through the transistors Tr7 and Tr9 increase to change a voltage Va at a node A and a voltage Vb at a node B, thereby increasing the current Ie and through current It. Namely, a negative feedback operation is carried out to keep the through current It constant.

The through current It is constant as follows:

$$It=S*T*Iref \quad (10)$$

The through current It is controllable by changing the ratio of the sizes of transistors. The AB-class amplifier of the second prior art of FIGS. 10A and 10B always makes the through current It constant.

The AB-class amplifier of the prior art prevents a fluctuation in the through current It by negative feedback. The transistors Tr4 and Tr22 that form the circuit for detecting the through current It involve voltage drops corresponding to the threshold voltages vthn and Vthp. If these threshold voltages are each about 1 V, they will cause a voltage drop of 2 V. Accordingly, the prior art is incapable of operating with a low-voltage power source.

Below, examples of a current detector circuit according to a second aspect of the present invention will be explained with reference to the accompanying drawings.

FIGS. 11A, 11B, 12, 13, and 14 show the principles of a second aspect of the present invention.

Figure 11A:
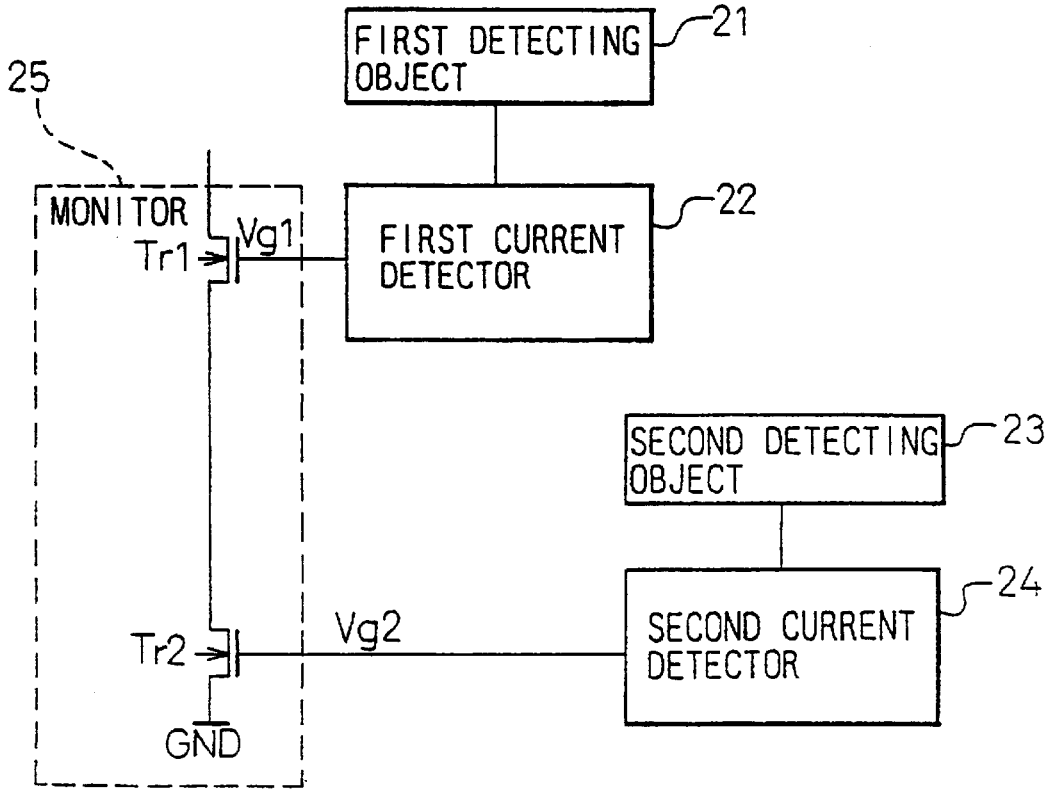

To solve the problems of the prior arts described above, a current detector circuit according a second aspect of the present invention of FIG. 11A has a first detecting object (detecting device) 21; a first current detector 22 for detecting a current flowing through the first detecting object 21; a second detecting object 23; a second current detector 24 for detecting a current flowing through the second detecting object 23; and a monitor 25. The monitor 25 includes a first transistor Tr1 having a control terminal connected to the output of the first current detector 22 and a second transistor Tr2 having a second terminal connected to a first terminal of the first transistor Tr1 and a control terminal connected to the output of the second current detector 24. The first and second transistors Tr1 and Tr2 have identical characteristics.

Figure 12:
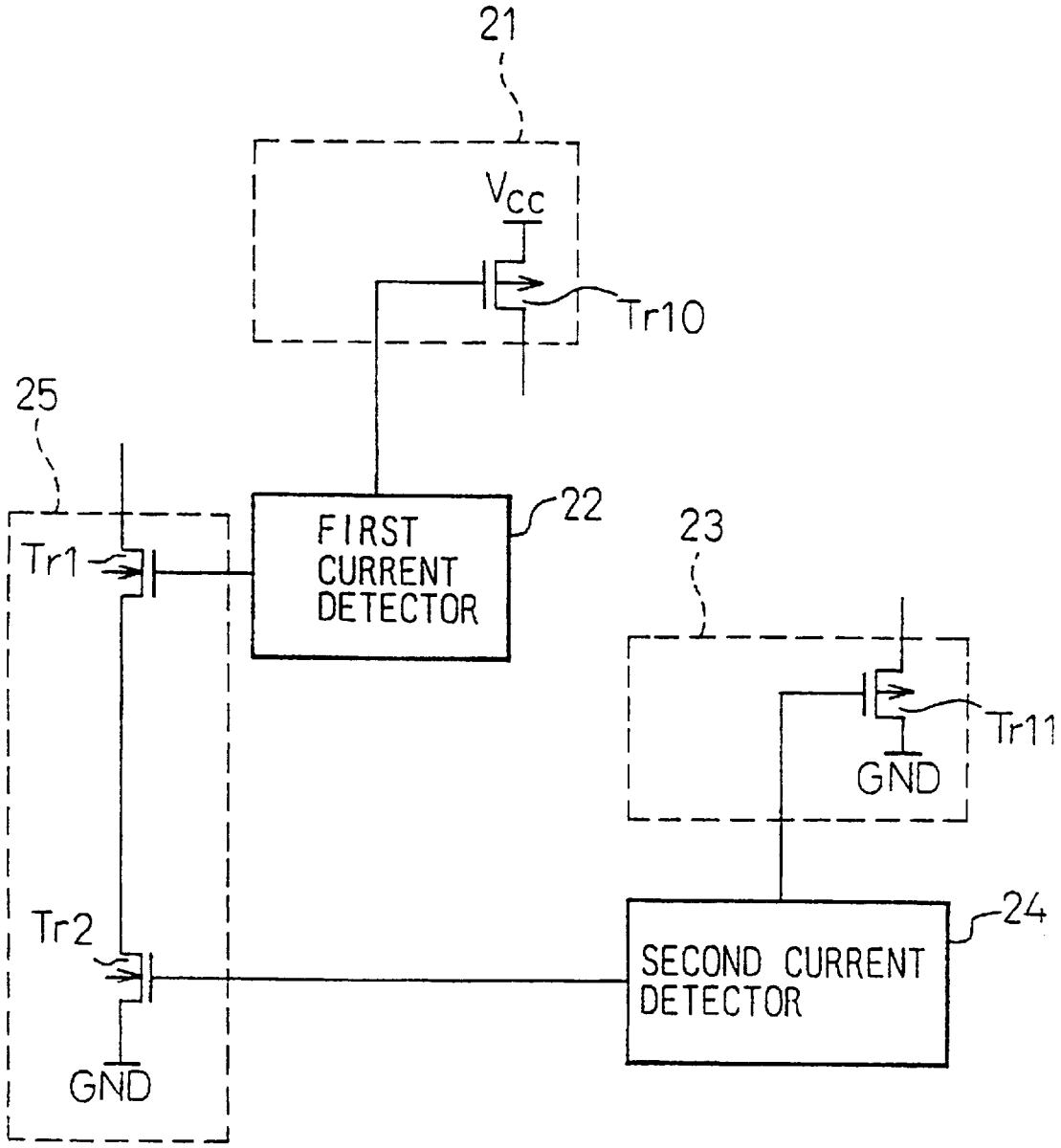
FIG. 12 is a diagram for explaining another principle of a current detector circuit according to the second aspect of the present invention.

The first detecting object of the current detector circuit preferably has a third transistor Tr10 as shown in FIG. 12.

Figure 13:
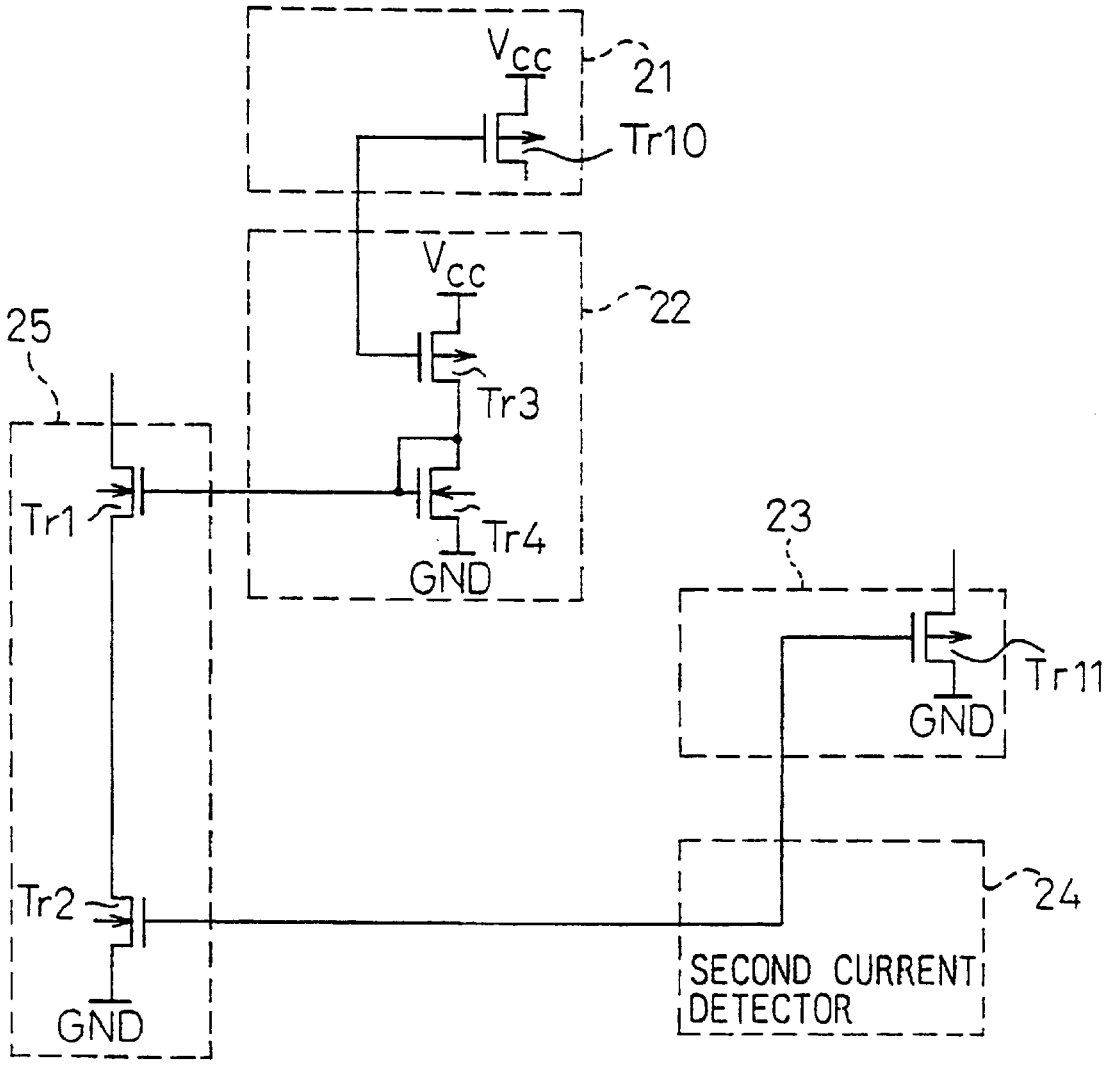
FIG. 13 is a diagram for explaining a still another principle of a current detector circuit according to the second aspect of the present invention.

The first current detector 22 of the current detector circuit preferably has a fourth transistor Tr3 having a control terminal connected to a control terminal of the third transistor Tr10; and a fifth transistor Tr4 having second and control terminals connected to a second terminal of the fourth transistor Tr3 and to a control terminal of the first transistor Tr1, as shown in FIG. 13.

Figure 14:
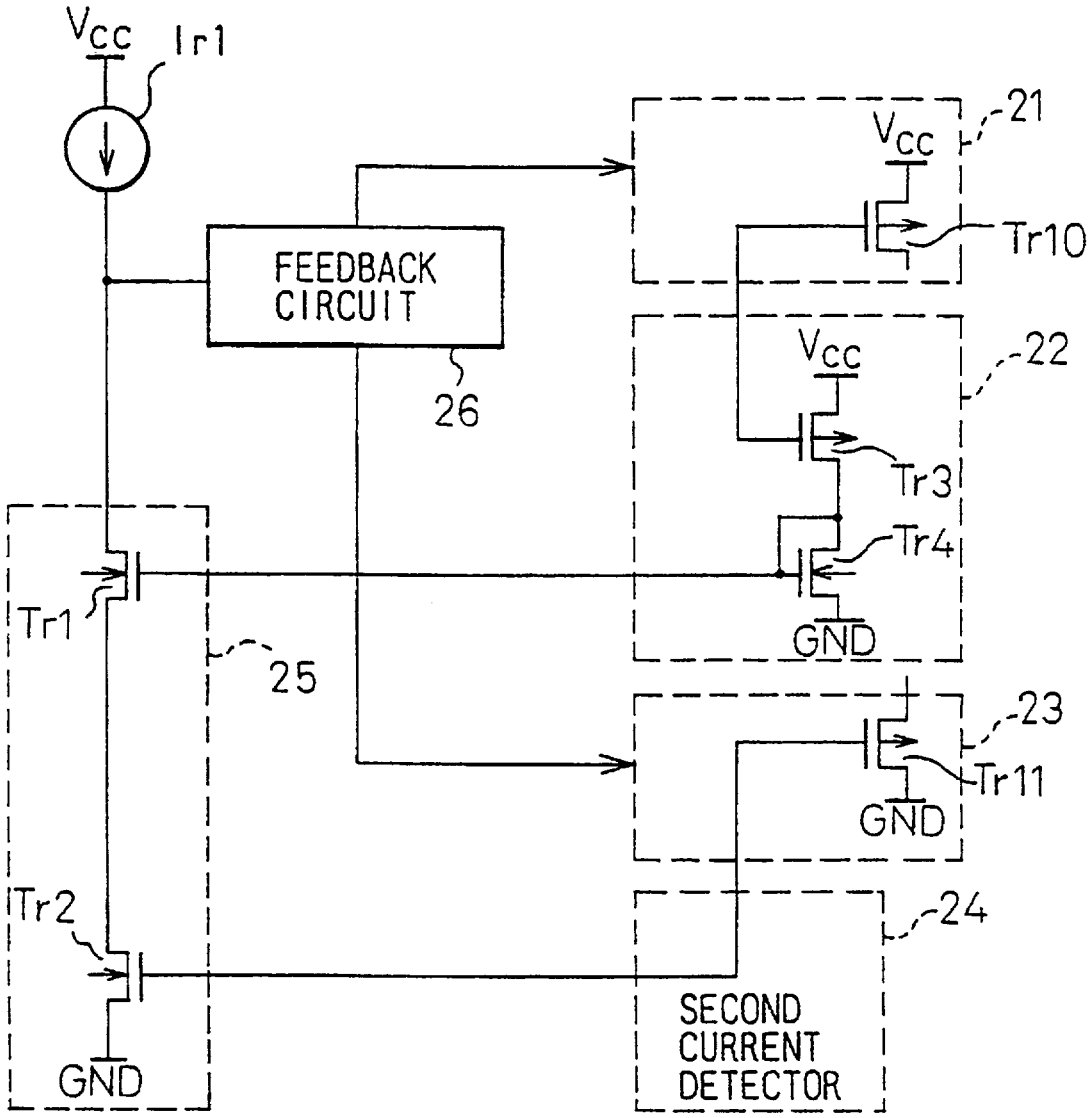
FIG. 14 is a diagram for explaining a still another principle of a current detector circuit according to the second aspect of the present invention.

The current detector circuit further preferably has a first current source Ir1 connected to a second terminal of the first transistor Tr1; and a feedback circuit 26 for fixing currents flowing through the first and second detecting objects 21 and 23 in response to a signal from the second terminal of the first transistor Tr1, as shown in FIG. 14.

Figure 11B:
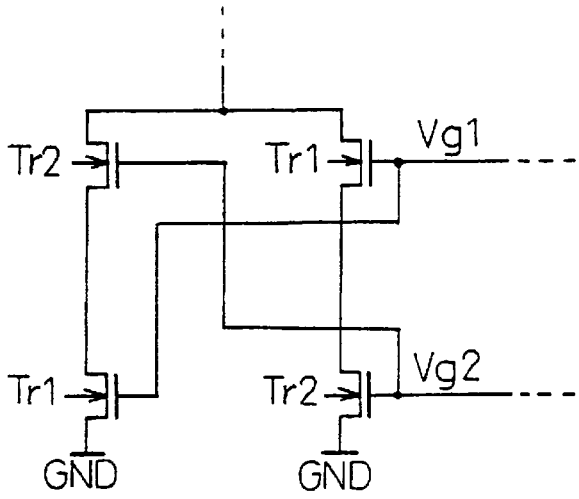

The monitor 25 of the current detector circuit preferably has a sixth transistor Tr2' having a second terminal connected to the second terminal of the first transistor Tr1 and a control terminal connected to the control terminal of the second transistor Tr2; and a seventh transistor Tr1' having a control terminal connected to the control terminal of the first transistor Tr1 and a second terminal connected to the first terminal of the sixth transistor Tr2', as shown in FIG. 11B.

The current detector circuit preferably includes the first, second, fifth, sixth, and seventh transistors of a first conductivity type, and the third and fourth transistors of a second conductivity type.

The current detector circuit includes preferably a second terminal as a drain or collector electrode, a control terminal as a gate or base electrode, and a first terminal as a source or emitter electrode.

The second aspect of the present invention can provide an amplifier employing the above current detector circuit.

In the following explanation, the first, second, fifth, sixth, and seventh transistors Tr1, Tr2, Tr4, Tr2', and Tr1' are first conductivity (N-channel) transistors, and the third and fourth transistors Tr10 and Tr3 are second conductivity (P-channel) transistors. Accordingly, the second terminal is a drain electrode, the control terminal is a gate electrode, and the first terminal is a source electrode.

In the current detector circuit shown in FIGS. 11A 10 to 14, the first current detector 22 detects a current flowing through the first detecting object 21, and the second current detector 24 detects a current flowing through the second detecting object 23. The monitor 25 generates a current in response to the currents detected by the first and second current detectors 22 and 24.

The monitor 25 consists of the first and second transistors Tr1 and Tr2. When these transistors Tr1 and Tr2 have the same characteristics, the current flowing through the transistors Tr1 and Tr2 is determined according to a lower one of the input voltages to the transistors Tr1 and Tr2.

When the input voltage Vg1 to the first transistor Tr1 is equal to the input voltage Vg2 to the second transistor Tr2, the transistors are equivalent to a transistor of half driving capacity. This will be explained.

1) When Vg1=Vg2=Vg

The first transistor Tr1 operates in a saturation region, and therefore, the following is established:

$$Ix=\beta(Vg-VA-Vth)^2/2 \quad (11)$$

The second transistor Tr2 operates in a triode region, and therefore, the following is established:

$$Ix=\beta\{2(Vg-Vth)VA-VA^2\}/2 \quad (12)$$

According to the expressions (11) and (12), the following is established:

$$Ix=\beta(Vg-Vth)^2/4 \quad (13)$$

2) When Vg1>Vg2

The first transistor Tr1 operates in a triode region and the second transistor Tr2 operates in a saturation region, so that the following is established:

$$Ix=\beta(Vg2-Vth)^2/2 \quad (14)$$

3) When Vg1<Vg2

The first transistor Tr1 operates in a saturation region and, therefore, the following is established:

$$Ix=\beta(Vg1-VA-Vth)^2/2 \quad (15)$$

Since the second transistor Tr2 operates in a triode region, the following is established:

$$Ix=\beta\{2(Vg2-Vth)VA-VA^2\}/2 \quad (16)$$

According to the expressions (15) and (16), the following is obtained:

$$VA=[(Vf2+Vf1)-\{(Vf2+Vf1)^2-2Vf1^2\}½]^{1/2} \quad (17)$$

Accordingly, the following is established:

$$Ix=\beta[Vf2_2+(Vf2-Vf1)\ \{(Vf2+Vf1)^2-2Vf1^2\}^{1/2}]/4 \quad (18)$$

According to the expression (17), the following is obtained:

$$③VA/③Vf2=[1-(Vf2+Vf1)/(Vf2+Vf1)^2-2Vf1^2\}^{1/2}]/2 \quad (19)$$

where Vf1=Vg1−Vth, and Vf2=Vg2−Vth When Vf1 is about 0, the following is obtained:

$$VA\approx 0, \text{ and } \delta VA/\delta Vf2\approx 0 \quad (20)$$

At this time, the gate voltage Vg1 of the first transistor Tr1 controls the current Ix.

According to the explanations in (i), (ii), and (iii), the current Ix is determined according to a lower one of the gate voltages of the first and second transistors Tr1 and Tr2.

The conventional current detector circuit connects four transistors at the maximum in series between power sources. Among the transistors, two are gate-drain-connected transistors to cause at least a voltage drop of 2 Vth. On the other hand, the current detector circuit of the present invention connects two transistors at the maximum (most) in series with no gate-drain-connected transistors. The current detector circuit of the present invention, therefore, is capable of operating with a low-voltage power source and with reduced power consumption.

According to the current detector circuit of the second aspect of the present invention of FIG. 11B, the monitor 25 has the first transistor Tr1, second transistor Tr2, sixth transistor Tr2', and seventh transistor Tr1'. This arrangement reduces fluctuations in a current flowing through the monitor when Vg1>Vg2 and when Vg1<Vg2.

The amplifier of the present invention employs the current detector circuit according to the second aspect of the present invention. This amplifier is capable of operating with a low-voltage power source and with reduced power consumption.

The amplifier employing the current detector circuit of the second aspect of the present invention has the feedback circuit 26 responding to a signal from the second terminal (drain electrode) of the first transistor Tr1. The feedback circuit 26 carries out negative feedback on the first and second current detecting objects 21 and 23, to control the current flowing through the first and second detecting objects 21 and 23 to a constant value. This amplifier is of class AB and is capable of suppressing a fluctuation in a through current passing through the output section of the amplifier.

Figure 15A:
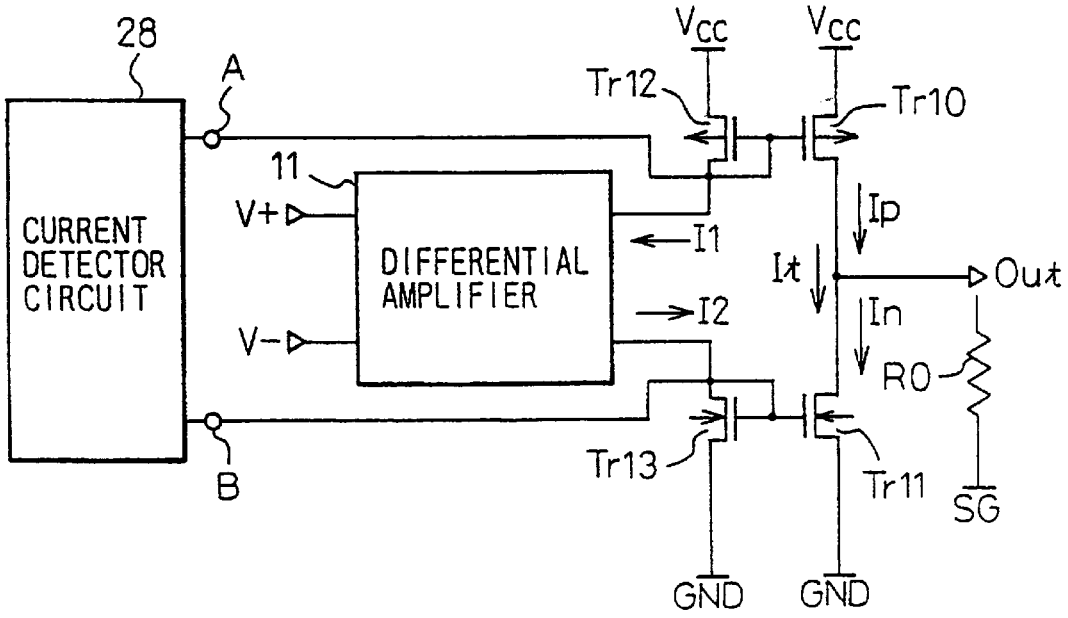
Figure 15B:
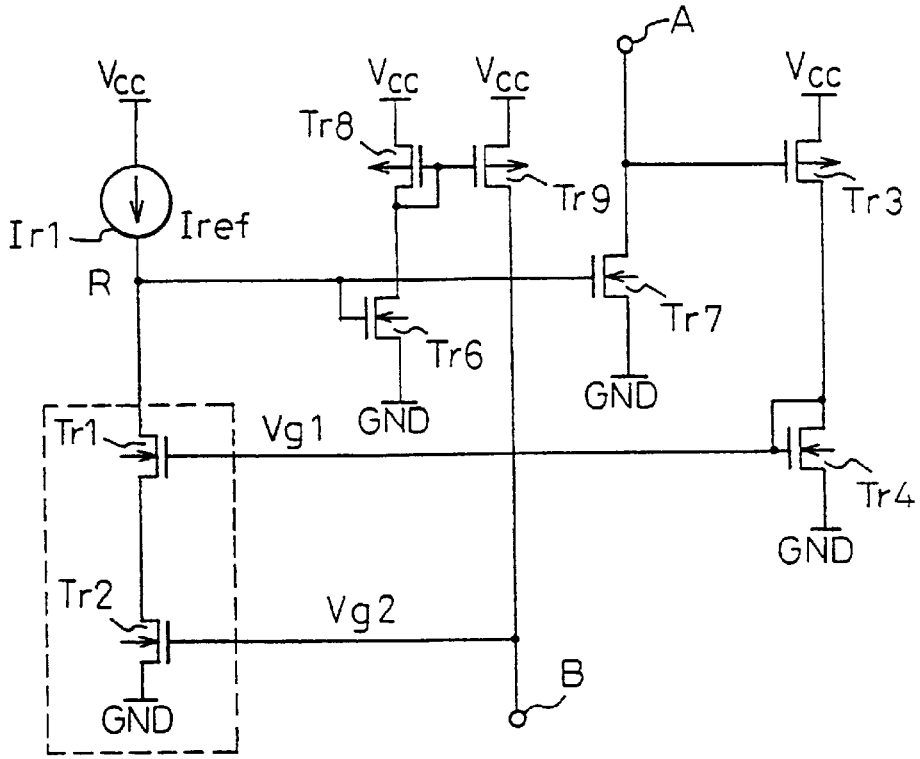

FIGS. 15A and 15B show an AB-class amplifier according to a first embodiment of the present invention. FIG. 15A is a circuit diagram generally showing the amplifier, and FIG. 15B is a circuit diagram showing a current detector circuit of the amplifier. The same parts as those of the second prior art of FIGS. 10A and 10B are represented with like reference marks.

In FIG. 15A, the AB-class amplifier of this embodiment has a differential amplifier 11, the current detector circuit 28, P-channel transistors Tr10 and Tr12, and N-channel transistors Tr11 and Tr13.

In FIG. 15B, the current detector circuit 28 has a first constant current source Ir1 for supplying a current Iref, P-channel transistors Tr3, Tr8, and Tr9, and N-channel transistors Tr1, Tr2, Tr4, Tr6, and Tr7.

The current detector circuit 28 (feedback system) carries out a negative feedback operation to let a constant through current It flow to an output section involving the transistors Tr10 and Tr11 of the amplifier.

The operation of the amplifier is the same as that of the second prior art except the current detector circuit 28 for detecting the through current It.

The P-channel transistor Tr10 is a first detecting object 21, and the N-channel transistor Tr11 is a second detecting object 23.

The P-channel transistor Tr3 and N-channel transistor Tr4 form a first current detector 22. The N-channel transistors Tr1 and Tr2 form a monitor 25. Signal lines to the gate electrodes of the transistors Tr1 and Tr2 form a second current detector 24.

The sizes of the transistors Tr1, Tr2, Tr3, and Tr4 are as follows:

$$Tr11/Tr1=Tr11/Tr2=S \quad (21)$$

$$Tr10/Tr3=Tr11/Tr4 \quad (22)$$

To satisfy the relational expression (22), output currents Ip and In and the input voltages Vg1 and Vg2 of the monitor 25 are as follows:

when Ip=In, Vg1=Vg2 when Ip>In, Vg1>Vg2 when Ip<In, Vg1<Vg2

Figures 16, 17:
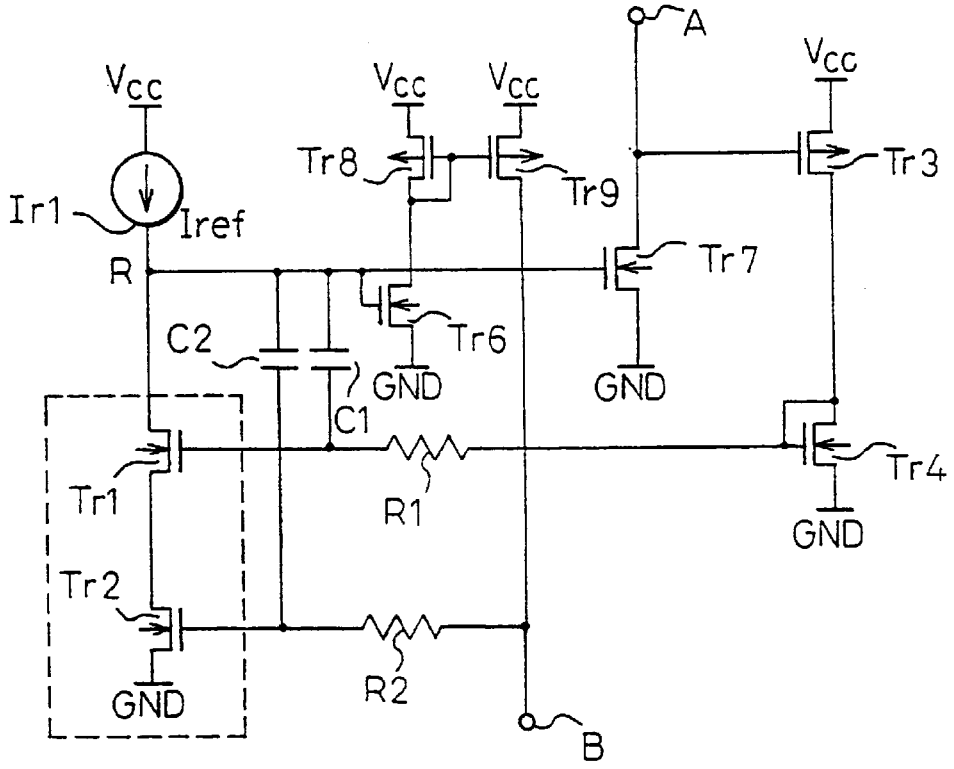
FIG. 16 is a diagram for explaining the operation of the first embodiment and a relationship between input voltages to a monitor and a through current.
FIG. 17 is a circuit diagram showing a current detector circuit of an AB-class amplifier according to a second embodiment of the second aspect of the present invention.

Accordingly, the through current It will be as shown in FIG. 16. In this figure, Iref is a current value provided by the first constant current source Ir1.

The through current It changes in the range of S*Iref to 2*S*Iref. By properly setting the current Iref and the ratio S of the transistor sizes, the AB-class amplifier is realized.

When "Ip>In" changes to "Ip<In," a change in the through current It is advantageous because the through current It is large.

The current detector circuit of the second prior art of FIG. 10B arranges the four transistors Tr3, Tr4, Tr21, and Tr22 in series between a power source Vcc and a ground GND. Two of these transistors are gate-drain-connected transistors. On the other hand, the current detector circuit 28 of the first embodiment arranges the two transistors Tr3 and Tr4 in series with no gate-drain-connected transistors. Accordingly, the amplifier of this embodiment is capable of operating with a low-voltage power source.

A current flowing through the transistors Tr1 and Tr2 in the monitor 25 of FIG. 15B fluctuates between Vg1>Vg2 and Vg1<Vg2.

Accordingly, the monitor 25 may consists of N-channel transistors Tr1, Tr2, Tr2', and Tr1' as shown in FIG. 11B, to improve symmetry and flatten fluctuations in a current flowing through the monitor.

FIG. 17 shows a current detector circuit of an AB-class amplifier according to a second embodiment of the present invention. The general arrangement of this amplifier is the same as the amplifier of FIG. 15A.

The current detector circuit of this embodiment consists of the current detector circuit 28 of the first embodiment of FIG. 15B plus a phase compensation circuit.

According to the current detector circuit 28 of the first embodiment, a high-frequency signal provided to the node A may be turned by 180 degrees (inverted) when it is passed through the transistors Tr3, Tr4, Tr1, and Tr7 to the node A (Tr3→Tr4→Tr1→Tr7→A), to thereby cause positive feedback. This may cause oscillation.

To prevent the high-frequency oscillation, the second embodiment employs a phase compensation circuit consisting of resistors R1 and R2 and capacitors C1 and C2.

The modification of FIG. 11B of the monitor 25 is also applicable to the second embodiment.

Figure 18:
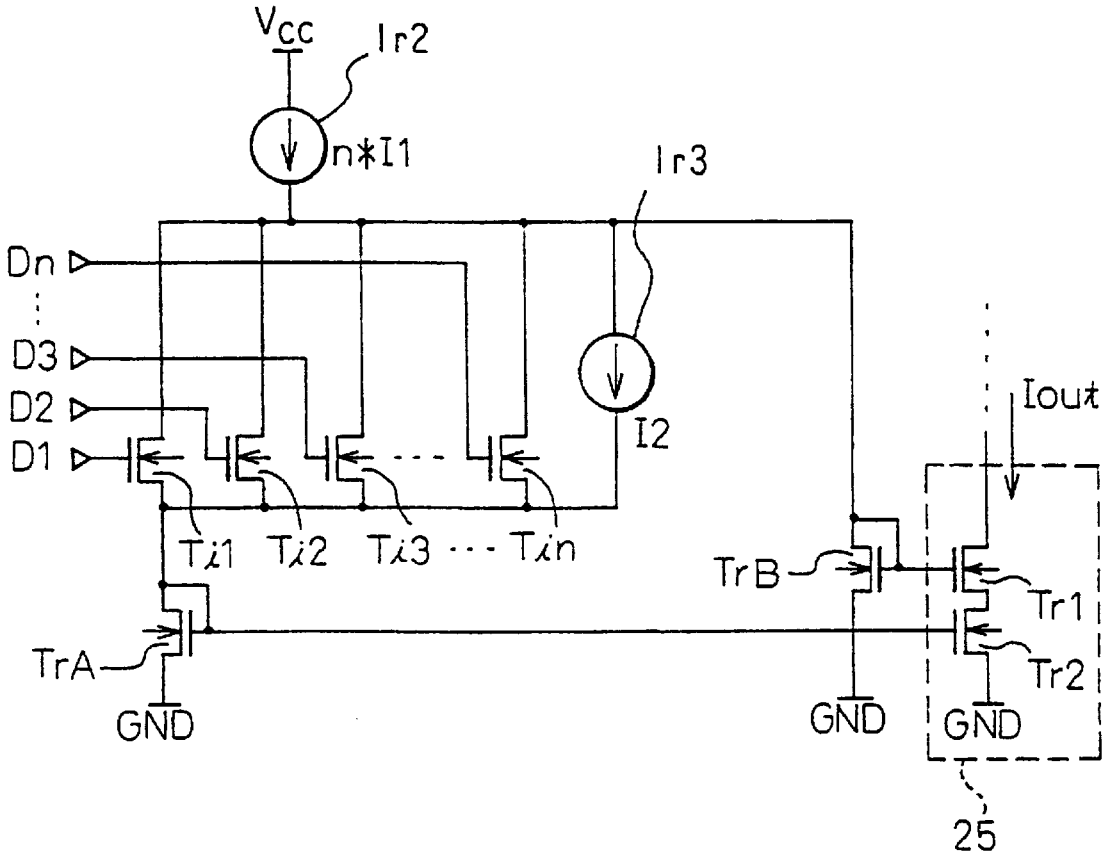
FIG. 18 is a circuit diagram showing a majority circuit according to a third embodiment of the second aspect of the present invention.

FIG. 18 is a circuit diagram showing a majority circuit according to a third embodiment of the present invention.

The majority circuit-sends a digital signal through several routes. Even if One of the routes inverts the signal due to a malfunction, a majority of the routes determine the output of the circuit. This circuit is highly reliable, and therefore, is adopted for processing, for example railroad signals that must be reliable.

The majority circuit has a second current source Ir2, a third current source Ir3, N-channel transistors Ti1 to Tin, TrA, TrB, Tr1, and Tr2.

The transistor TrB forms a first current detector 22, the transistors Ti1 to Tin and TrA form a second current detector 24, and the transistors Tr1 and Tr2 form a monitor 25.

Digital input signals D1 to Dn of the same signal level (high or low) are supplied to the gate electrodes of the transistors Ti1 to Tin, respectively. The transistors Ti1 to Tin have the identical characteristics. When a digital input signal Dk (k is one of 1 to n) is at high level, a transistor Tik passes a current of I1 A. The second current source Ir2 provides a current of n*I1 A, and the third current source Ir3 provides a weak current of I2 A.

When the digital input signals D1 to Dn are correct, i.e., when they are each at high or low level, one of the transistors TrA and TrB is cut off to supply no current to the monitor 25. Accordingly, a current I(TrA) to the transistor TrA, a current I(TrB) to the transistor TrB, and a current Iout to the monitor 5 are as shown in FIG. 19A.

If a digital input signal Dk (k is one of 1 to n) is inverted due to a fault, a current of I1A flows to one of the transistors TrA and TrB and a current of S*I1 A proportional to the current I1A flows to the monitor 5, as shown in FIG. 19B. As a result, the fault is detectable. Here, S is a transfer ratio.

In theory, the majority circuit of this embodiment is capable of detecting a plurality of faults. In practice, however, the number of detectable faults is not so large due to the characteristics of the current detector circuit. The modification of the monitor 25 shown in FIG. 11B is also applicable to this embodiment. Although the first to third embodiments employ MOS transistors, the present invention may employ bipolar transistors constituting TTLs.

The above described current detector circuits can be constituted as operational amplifiers, or a semiconductor integrated circuits.

According to the current detector circuit of a second aspect of the present invention, the first current detector detects a current flowing through the first detecting object, and the second current detector detects a current flowing through the second detecting object. The outputs of the first and second current detectors are supplied to the first and second transistors, with the identical characteristics, of the monitor, respectively. The current flowing through the first and second transistors is determined by the lower one of the input voltages to the first and second transistors. Accordingly, the current detector circuit is realized by the two transistors at the maximum connected in series. This arrangement is capable of operating with a lowvoltage power source and of reducing the power consumption. When the monitor consists of the first, second, sixth, and seventh transistors, fluctuations in the current flowing through the monitor are reduced.

The amplifier according to the present invention employs any one of the current detector circuits of the second aspect of the present invention. This amplifier is capable of operating with a low-voltage power source and reduced power consumption. The amplifier employing the current detector circuit of the second aspect of the present invention includes the feedback circuit that receives an input signal from the second terminal (drain electrode) of the first transistor. The feedback circuit carries out a feedback operation on the first and second detectors, to control a current flowing through the first and second detectors. This AB-class amplifier is capable of suppressing fluctuations in a through current flowing to the output section of the amplifier.

Many different embodiments of the present invention may be constructed without departing from the spirit and scope of the present invention, and it should be understood that the present invention is not limited to the specific embodiments described in this specification, except as defined in the appended claims.

What is claimed is:

1. An operational amplifier comprising:

a differential amplification section;

an output section having a first transistor of a first conductivity type and a second transistor of a second conductivity type that is opposite to said first conductivity type, said first and second transistors being connected in series between a first power source means and a second power source means, said first transistor being driven according to an output of said differential amplification section;

a control signal [generation means] *generator* for detecting a current flowing through said first transistor and generating a control signal in response to the detected current; and a drive [control means] *controller* for controlling said second transistor to increase *or decrease* a current flowing through said second transistor if the current flowing through said first transistor detected by said control signal [generation means] *generator* decreases *or increases, respectively*.

2. An operational amplifier as claimed in claim 1, wherein:

said control signal [generation means] *generator* has a third transistor of said first conductivity type having a first terminal connected to said first power source means and a control terminal connected to the output of said differential amplification section as well as to the control terminal of said first transistor[; and said drive control means has fourth and fifth transistors of said first conductivity type having first terminals connected to said first power source means, a sixth transistor of said second conductivity type having a first terminal connected to said second power source means and a control terminal and a second terminal connected to the second terminal of said fifth transistor as well as to the control terminal of said second transistor, and a constant current source, the control terminal and second terminal of said fourth transistor being connected to said second power source means through said constant current source, to the control terminal of said fifth transistor, and to the second terminal of said third transistor, to receive the control signal from said control signal generation means].

3. An operational amplifier as claimed in claim [2] *15*, wherein *a current flowing through* said first transistor is [connected] *proportional* to *a current flowing through* said [third transistor in a current mirror configuration,] *control signal generator, and* said fourth transistor is connected to said fifth transistor in a current mirror configuration[, and said second transistor is connected to said sixth transistor in a current mirror configuration].

4. An operational amplifier as claimed in claim 1, wherein:

[said control signal generation means has a third transistor of a first conductivity type having a first terminal connected to said first power source means and a control terminal connected to the output of said differential amplification section as well as to the control terminal of said first transistor; and]

a drive [control means] *controller* has fourth, fifth, and sixth transistors of said second conductivity type having first terminals connected to said second power source means, and a constant current source, the second terminal of said fifth transistor, the second terminal and control terminal of said sixth transistor, and the control terminal of said second transistor being connected to said first power source means through said constant current source, the second terminal and control terminal of said fourth transistor and the control terminal of said fifth transistor being connected to [the second terminal of said third transistor] *an output terminal of said control signal generator*, to receive the control signal from said control signal [generation means] *generator*.

5. An operational amplifier as claimed in claim 4, wherein *a current flowing through* said first transistor is [connected] *proportional* to *a current flowing through* said [third transistor in a current mirror configuration] *control signal generator*, said fourth transistor is connected to said fifth transistor in a current mirror configuration, and said second transistor is connected to said sixth transistor in a current mirror configuration.

6. An operational amplifier as claimed in claim 1, wherein said drive [control means] *controller* controls said second transistor to [pass] *increase* a current *thereof* if a current flowing through said first transistor detected by said control signal [generation means is larger than a predetermined value] *generator is decreased; and controls said second transistor to decrease the current thereof if the current flowing through said first transistor detected by said control signal generator is increased.*

7. An operational amplifier as claimed in claim [6] *1*, wherein:

[said control signal generation means has a third transistor of said first conductivity type having a first terminal connected to said first power source means and a control terminal connected to the output of said differential amplification section as well as to the control terminal of said first transistor; and]

said drive [control means] *controller* has a *first* load means, a fourth transistor of said first conductivity type having a first terminal connected to the control terminal of said first transistor as well as to [the control terminal of said third transistor] *an input terminal of said control signal generator* and a second terminal connected to the control terminal of said second transistor as well as to said second power source means through said *first* load means, and a [first constant current source, the second terminal of said third transistor] *second load means, an output terminal of said control signal generator* and the control terminal of said fourth transistor being connected to said second power source means through said [first constant current source] *second load means*.

8. An operational amplifier as claimed in claim [7] *1*, wherein said operational amplifier further comprises a second constant current source arranged between said second power source means and a node between the second terminal of said first transistor and the second terminal of said second transistor.

9. An operational amplifier as claimed in claim 7, wherein *a current flowing through* said first transistor is [connected] *proportional* to *a current flowing through* said [third transistor in a current mirror configuration] *control signal generator*.

10. An operational amplifier as claimed in [claim 7] *any one of claims 1 to 9 or 15 to 17*, wherein:

said differential amplification section has third and fourth transistors of said second conductivity type, fifth and sixth transistors of said first conductivity type, and a constant current source, the first terminals of said third and fourth transistors being connected to said second power source means through said constant current source, the control terminals of said third and fourth transistors receiving first and second inputs, respectively, the first terminals of said fifth and sixth transistors being connected to said first power source means, the control terminals of said fifth and sixth transistors being connected to the second terminal of said fifth transistor as well as to the second terminal of said third transistor, the output of said differential amplification section being provided from a node between the second terminal of said sixth transistor and the second terminal of said fourth transistor.

11. An operational amplifier as claimed in [claim 1] *any one of claims 1 to 9 or 15 to 17*, wherein, in said output section, the first terminal of said first transistor is connected to said first power source means, the control terminal of said first transistor is connected to the output of said differential amplification section, the first terminal of said second transistor is connected to said second power source means, the control terminal of said second transistor is connected to the output of said drive control means, and a node between the second terminal of said first transistor and the second terminal of said second transistor provides the output of said operational amplifier.

12. An operational amplifier as claimed in any one of claims 1 [or 3] to [11] *9 or 15 to 17*, wherein said first conductivity type is a P-channel type, said second conductivity type is an N-channel type, said transistors are MIS transistors, said first terminal is a source, said second terminal is a drain, and said control terminal is a gate.

13. An operational amplifier as claimed in any one of claims 1 [or 3] to [11] *9 or 15 to 17*, wherein said first conductivity type is a PNP type, said second conductivity type is an NPN type, said transistors are bipolar transistors, said first terminal is an emitter, said second terminal is a collector, and said control terminal is a base.

14. An operational amplifier as claimed in any one of claims 1 [or 3 to 11] *to 9 or 15 to 17*, wherein said operational amplifier constitutes a semiconductor integrated circuit.

*15. An operational amplifier as claimed in claim 1, wherein:*

*said drive controller has fourth and fifth transistors of said first conductivity type having first terminals connected to said first power source means, and a constant current source, the control terminal and second terminal of said fourth transistor being connected to said second power source means through said constant current source, to the control terminal of said fifth transistor, and to an output terminal of said control signal generator, in order to receive the control signal from said control signal generator.*

*16. An operational amplifier as claimed in claim 15, wherein*

*said drive controller further has a sixth transistor of said second conductivity type having a first terminal connected to said second power source means and a control terminal and a second terminal connected to the second terminal of said fifth transistor as well as to the control terminal of said second transistor.*

*17. An operational amplifier as claimed in claim 16, wherein said second transistor is connected to said sixth transistor in a current mirror configuration.*

*18. An operational amplifier as claimed in any one of claims 1 to 9 or 15 to 17, wherein said first conductivity type is an N-channel type, said second conductivity type is a P-channel type, said transistors are MIS transistors, said first terminal is a source, said second terminal is a drain, and said control terminal is a gate.*

*19. An operational amplifier as claimed in any one of claims 1 to 9 or 15 to 17, wherein said first conductivity type is an NPN type, said second conductivity type is a PNP type, said transistors are bipolar transistors, said first terminal is an emitter, said second terminal is a collector, and said control terminal is a base.*

*20. An operational amplifier comprising:*

*an output section having a first transistor of a first conductivity type and a second transistor of a second conductivity type that is opposite to said first conductivity type, said first and second transistors being connected in series between a first power source means and a second power source means, said first transistor being driven according to a driving signal;*

*a control signal generator for detecting a current flowing through said first transistor and generating a control signal in response to the detected current; and*

*a drive controller for controlling said second transistor to increase or decrease a current flowing through said second transistor if the current flowing through said first transistor detected by said control signal generator decreases or increases, respectively.*

*21. An operational amplifier as claimed in claim 20, wherein:*

*said control signal generator has a third transistor of said first conductivity type having a first terminal connected to said first power source means and a control terminal which receives said driving signal and is connected to the control terminal of said first transistor.*

*22. An operational amplifier as claimed in claim 20, wherein:*

*said drive controller has fourth and fifth transistors of said first conductivity type having first terminals connected to said first power source means, and a constant current source, the control terminal and second terminal of said fourth transistor being connected to said second power source means through said constant current source, to the control terminal of said fifth transistor and to an output terminal of said control signal generator, in order to receive the control signal from said control signal generator.*

*23. An operational amplifier as claimed in claim 22, wherein:*

*said drive controller further has a sixth transistor of said second conductivity type having a first terminal connected to said second power source means and a control terminal and a second terminal connected to the second terminal of said fifth transistor as well as to the control terminal of said second transistor.*

*24. An operational amplifier as claimed in claim 22, wherein a current flowing through said first transistor is proportional to a current flowing through said control signal generator, and said fourth transistor is connected to said fifth transistor in a current mirror configuration.*

*25. An operational amplifier as claimed in claim 23, wherein said second transistor is connected to said sixth transistor in a current mirror configuration.*

*26. An amplifier comprising:*

*an output section having a first transistor of a first conductivity type and a second transistor of a second conductivity type that is opposite to said first conductivity type, said first and second transistors being connected in series between a first power source means and a second power source means, said first transistor being driven according to a driving signal;*

*a control signal generator for detecting a current flowing through said first transistor and generating a control signal in response to the detected current; and*

*a drive controller for controlling said second transistor to increase or decrease a current flowing through said second transistor if the current flowing through said first transistor detected by said control signal generator decreases or increases, respectively.*

*27. An amplifier as claimed in claim 26, wherein*

*said control signal generator has a third transistor of said first conductivity type having a first terminal connected to said first power source means and a control terminal which receives said driving signal as well as the control terminal of said first transistor.*

*28. An amplifier as claimed in claim 27, wherein:*

*said drive controller has fourth and fifth transistors of said first conductivity type having first terminals connected to said first power source means, and a constant*

*current source, the control terminal and second terminal of said fourth transistor being connected to said second power source means through said constant current source, to the control terminal of said fifth transistor, and to an output terminal of said control signal generator, in order to receive the control signal from said control signal generator.*

*29. An amplifier as claimed in claim 28, wherein:*

*said drive controller further has a sixth transistor of said second conductivity type having a first terminal connected to said second power source means and a control terminal and a second terminal connected to the second terminal of said fifth transistor as well as to the control terminal of said second transistor.*

*30. An amplifier as claimed in claim 28, wherein a current flowing through said first transistor is proportional to a current flowing through said control signal generator, and said fourth transistor is connected to said fifth transistor in a current mirror configuration.*

*31. An amplifier as claimed in claim 29, wherein said second transistor is connected to said sixth transistor in a current mirror configuration.*

* * * * *